US009880371B2

(12) United States Patent
Gutierrez et al.

(10) Patent No.: US 9,880,371 B2
(45) Date of Patent: *Jan. 30, 2018

(54) MEMS ELECTRICAL CONTACT SYSTEMS AND METHODS

(71) Applicant: DigitalOptics Corporation, San Jose, CA (US)

(72) Inventors: Roman C. Gutierrez, Arcadia, CA (US); Robert J. Calvet, Pasadena, CA (US); Ankur Jain, Cerritos, CA (US)

(73) Assignee: DigitalOptics Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/362,252

(22) Filed: Nov. 28, 2016

(65) Prior Publication Data

US 2017/0329098 A1    Nov. 16, 2017

Related U.S. Application Data

(63) Continuation of application No. 14/585,172, filed on Dec. 29, 2014, now Pat. No. 9,515,579, which is a (Continued)

(51) Int. Cl.
G02B 26/00 (2006.01)
G02B 26/08 (2006.01)
(Continued)

(52) U.S. Cl.
CPC ............ *G02B 7/10* (2013.01); *B81C 1/00301* (2013.01); *G03B 5/00* (2013.01); *G03B 13/36* (2013.01);
(Continued)

(58) Field of Classification Search
CPC ............ G02B 26/0841; G02B 26/0825; H04N 5/7425; G02F 1/29; G03B 21/625; G03B 21/602; G03B 21/62
(Continued)

(56) References Cited

U.S. PATENT DOCUMENTS

| 8,004,780 B2 * | 8/2011 | Gutierrez | G02B 7/102 359/824 |
| 2003/0122206 A1 * | 7/2003 | Bhattarai | B81B 7/04 257/415 |
| 2010/0237965 A1 * | 9/2010 | Mi | H01P 1/2039 333/205 |

FOREIGN PATENT DOCUMENTS

| CN | 101301993 A | 11/2008 |
| CN | 101351399 A | 1/2009 |

(Continued)

OTHER PUBLICATIONS

CN Application No. 2014800724904, Office Action dated Apr. 21, 2017 (with English machine translation).
(Continued)

*Primary Examiner* — Dawayne A Pinkney

(57) ABSTRACT

A microelectromechanical systems (MEMS) device may be provided with one or more sintered electrical contacts. The MEMS device may be a MEMS actuator or a MEMS sensor. The sintered electrical contacts may be silver-paste metalized electrical contacts. The sintered electrical contacts may be formed by depositing a sintering material such as a metal paste, a metal preform, a metal ink, or a metal powder on a wafer of released MEMS devices and heating the wafer so that the deposited sintering material diffuses into a substrate of the device, thereby making electrical contact with the device. The deposited sintering material may break through an insulating layer on the substrate during the sintering process. The MEMS device may be a multiple degree of
(Continued)

freedom actuator having first and second MEMS actuators that facilitate autofocus, zoom, and optical image stabilization for a camera.

23 Claims, 15 Drawing Sheets

Related U.S. Application Data continuation-in-part of application No. PCT/US2014/064445, filed on Nov. 6, 2014, and a continuation-in-part of application No. 13/840,576, filed on Mar. 15, 2013, now Pat. No. 9,426,344, which is a continuation-in-part of application No. 12/946,515, filed on Nov. 15, 2010, now Pat. No. 8,619,378, which is a continuation-in-part of application No. 13/247,898, filed on Sep. 28, 2011, now Pat. No. 8,768,157, said application No. 14/585,172 is a continuation-in-part of application No. 14/042,214, filed on Sep. 30, 2013, now Pat. No. 8,922,870, which is a continuation of application No. 12/946,396, filed on Nov. 15, 2010, now Pat. No. 8,547,627.

(60) Provisional application No. 61/902,748, filed on Nov. 11, 2013, provisional application No. 61/622,480, filed on Apr. 10, 2012.

(51) Int. Cl.
*G02B 26/02* (2006.01)
*G02B 7/10* (2006.01)
*B81C 1/00* (2006.01)
*H02N 1/00* (2006.01)
*G03B 13/36* (2006.01)
*G03B 5/00* (2006.01)

(52) U.S. Cl.
CPC ........... *H02N 1/008* (2013.01); *B81C 1/0038* (2013.01); *B81C 1/00317* (2013.01)

(58) Field of Classification Search
USPC ................ 359/290–292, 245, 260–263, 298, 359/301–303, 317–318, 233, 224–225, 359/295, 198
See application file for complete search history.

(56) References Cited

FOREIGN PATENT DOCUMENTS

| | | |
|---|---|---|
| CN | 101841074 A | 9/2010 |
| CN | 101964272 A | 2/2011 |
| CN | 102915949 A | 2/2013 |
| CN | 103115704 A | 5/2013 |
| CN | 103420330 A | 12/2013 |

OTHER PUBLICATIONS

CN Application No. 2014800724904, Search Report dated Apr. 13, 2017 (with English machine translation).

\* cited by examiner

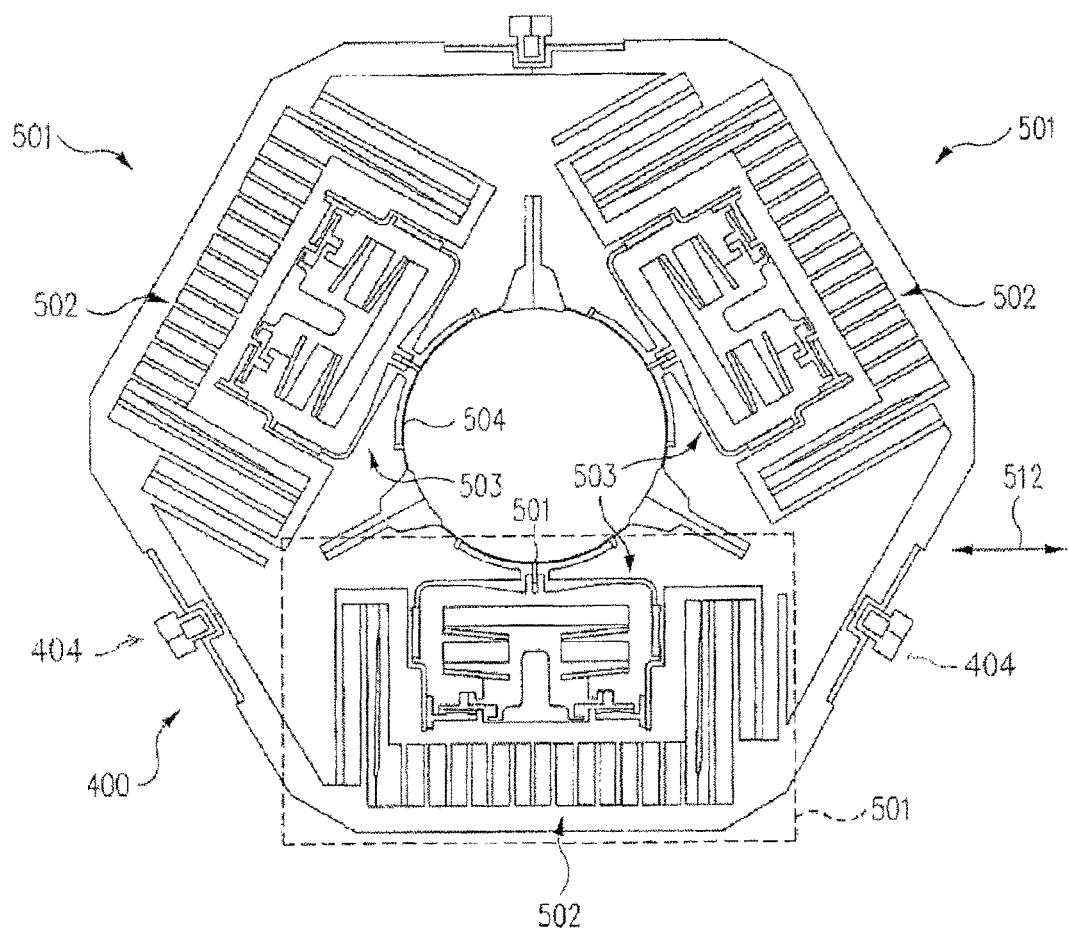
FIG. 5
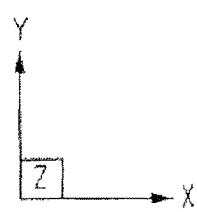

MEMS ELECTRICAL CONTACT SYSTEMS AND METHODS

CROSS-REFERENCE TO RELATED APPLICATIONS

This application is a Continuation of U.S. patent application Ser. No. 14/585,172 filed Dec. 29, 2014, which is a Continuation-in-Part of International Patent Application No. PCT/US14/64445 filed Nov. 6, 2014, which claims priority to and the benefit of U.S. Provisional Patent Application No. 61/902,748, filed Nov. 11, 2013, all of which are incorporated herein by reference in their entireties.

U.S. patent application Ser. No. 14/585,172 is also a Continuation-in-Part of U.S. patent application Ser. No. 13/840,576 filed Mar. 15, 2013, which is a Continuation-in-Part of U.S. patent application Ser. No. 12/946,515 filed Nov. 15, 2010 and U.S. patent application Ser. No. 13/247,898 filed Sep. 28, 2011 (now U.S. Pat. No. 8,768,157 issued Jul. 1, 2014) and which also claims priority to and the benefit of U.S. Provisional Patent Application No. 61/622,480, filed Apr. 10, 2012, all of which are incorporated herein by reference in their entireties.

U.S. patent application Ser. No. 14/585,172 is also a Continuation-in-Part of U.S. patent application Ser. No. 14/042,214 filed Sep. 30, 2013, which is a continuation of U.S. patent application Ser. No. 12/946,396 filed Nov. 15, 2010 now U.S. Pat. No. 8,547,627 issued Oct. 1, 2013, all of which are incorporated herein by reference in their entireties.

TECHNICAL FIELD

One or more embodiments relate generally to microelectromechanical systems (MEMS) and, more particularly, to electrical contacts for MEMS devices.

BACKGROUND

Microelectromechanical systems (MEMS) devices such as MEMS actuators and MEMS sensors are well known. MEMS devices can be made using various wafer level processing techniques. Electrical contacts for MEMS devices are often formed using metal sputtering and patterning processes during wafer fabrication. MEMS devices in particular often include movable or actuatable portions that have to be released in an etch process after wafer fabrication.

In some situations, if care is not taken, etch processes of this type or other wafer fabrication processes such as high-temperature processes can negatively affect metal contacts formed during wafer fabrication. In some cases, metal contacts for MEMS devices are formed after release using a shadow mask during evaporation of released wafers or dies. However, shadow masking operations of this type can be prohibitively expensive and/or labor intensive.

It would therefore be desirable to provide improved electrical contacts for MEMS devices.

SUMMARY

In accordance with an embodiment, a MEMS device may include one or more electrical contacts for electrically connecting the MEMS device to external circuitry. The electrical contacts may be metalized electrical contacts such as silver-paste metalized electrical contacts or other electrical contacts formed by sintering a material on the MEMS device. Sintering material may include a metal paste such as a silver paste, a metal preform, a metal powder, a metal ink, or other suitable materials or combinations of materials for forming metal contacts by sintering on a MEMS device. Electrical contacts such as silver-paste-metalized contacts can be formed on a surface of the MEMS device, on an extended portion of an edge of the MEMS device, or otherwise disposed on the MEMS device. Sintered electrical contacts such as silver-paste-metalized electrical contacts can be formed on any suitable MEMS device such as a MEMS sensor or a MEMS actuator. External circuitry may include lead lines, printed circuits such as printed circuit boards, or other circuitry that can be coupled to the MEMS device through the sintered electrical contacts.

Electrical contacts formed by sintering material on a MEMS device may be formed by providing a wafer of unsingulated MEMS devices, performing processing operations such as etching operations to release actuating portions of the MEMS devices on the wafer, depositing sintering material on the released MEMS wafer, and sintering the sintering material by heating the wafer. In this way, metal contacts that may be adversely affected by semiconductor processing operations such as etching operations can be formed on a MEMS device after etching operations to release moving portions of the MEMS device have been completed. The wafer may be singulated to form individual MEMS devices before or after sintering operations.

In accordance with an embodiment, a device can comprise at least one first MEMS actuator configured to move a platform in translation along a first axis. At least one second MEMS actuator can be configured to move the platform in a direction that is generally perpendicular to the first axis. The device can include at least one silver-paste-metalized electrical contact. The silver-paste-metalized electrical contact may be an extended portion of an actuator that includes a silver paste dot configured to be attached to a lead line using conductive epoxy.

In accordance with an embodiment, the device may include a first silver-paste-metalized electrical contact configured to be connected to a control lead line for supplying a control voltage using conductive epoxy and a second silver-paste-metalized electrical contact configured to be connected to a reference lead line for supplying a reference voltage using conductive epoxy.

In accordance with an embodiment, an actuator assembly can comprise at least one first MEMS actuator configured to move a platform in translation and at least one second MEMS actuator configured to move, e.g., rotate, the platform tangentially.

In accordance with an embodiment, a MEMS actuator assembly can comprise a plurality of nested actuators configured to focus a camera and to provide optical image stabilization for the camera.

In accordance with an embodiment, a method for operating a camera can comprise moving a platform in translation with at least one first MEMS actuator and moving the platform tangentially with at least one second MEMS actuator.

In accordance with an embodiment, a multiple degree of freedom actuator can comprise a fixed frame, a platform that is movable with respect to the fixed frame, and three independently movable MEMS actuators interconnecting the fixed frame and the platform. The three MEMS actuators can be configured to cooperate to move the platform in three degrees of freedom.

In accordance with an embodiment, a method can comprise providing a platform that is movable with respect to a fixed frame. The platform can be moved in three degrees of freedom using three independently movable MEMS actuators.

The scope of the invention is defined by the claims, which are incorporated into this Summary by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIG. 5 shows a multiple degree of freedom actuator, in accordance with an embodiment.

Embodiments of the invention and their advantages are best understood by referring to the detailed description that follows. It should be appreciated that like reference numerals are used to identify like elements illustrated in one or more of the figures.

DETAILED DESCRIPTION

Figure 1:
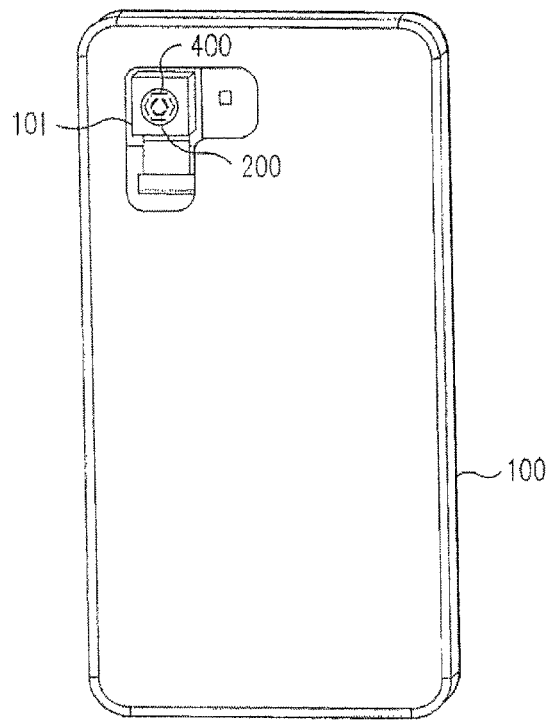
FIG. 1 shows an electronic device having a MEMS device, in accordance with an embodiment.

A MEMS device such as a MEMS actuator or a MEMS sensor suitable for use in a wide variety of different electronic devices is disclosed in accordance with various embodiments. The MEMS device may include at least one sintered electrical contact. The sintered electrical contact may be formed from an electrical contact having a sintered material such as a sintered metal powder, a sintered metal paste, or a sintered metal preform. In one embodiment, a sintered electrical contact may be a metalized electrical contact such as a silver-paste-metalized electrical contact.

According to an embodiment, a sintered electrical contact (sometimes referred to herein as a metalized electrical contact) on a MEMS device may be formed during wafer level processing by, after releasing the MEMS wafer (e.g., by etching away a material such as an oxide material that secures moving or actuating portions of MEMS devices on the wafer), depositing material such as a metal powder, a metal preform, a metal ink, or a metal paste such as a silver paste at electrical contact locations on the MEMS wafer, heating the MEMS wafer (e.g., to sinter the deposited material) to form the sintered electrical contacts, and singulating the wafer to form individual MEMS devices with sintered electrical contacts such as silver-paste-metalized electrical contacts.

In one embodiment, the MEMS device may be a multiple degree of freedom actuator. The multiple degree of freedom actuator may be adapted for use in a camera, such as a miniature camera, for example. The multiple degree of freedom actuator may be used to either manually or automatically focus the miniature camera. The multiple degree of freedom actuator may be used to zoom the miniature camera. The multiple degree of freedom actuator may be used to facilitate centration of an optical element. The multiple degree of freedom actuator may be used to provide optical image stabilization (OIS) for the miniature camera. The multiple degree of freedom actuator may be used to align optics (such as to actively align the optics during use thereof), e.g., provide fine alignment for lenses or other optical elements, within the camera. The multiple degree of freedom actuator may be used for optical correction, e.g., to mitigate undesirable effects of flaws in optical elements. For example, a lens may be rotated to place a defect therein in a more desirable (or less harmful) position. The multiple degree of freedom actuator may be used for any other desired application in an electronic device or in any other device.

In accordance with one or more embodiments, the multiple degree of freedom actuator may comprise one or more MEMS actuators. For example, the multiple degree of freedom actuator may comprise linear comb drives and rotational comb drives.

The multiple degree of freedom actuator may be formed using monolithic construction. The multiple degree of freedom actuator may be formed using non-monolithic construction. The multiple degree of freedom actuator may be formed using contemporary fabrication techniques, such as etching and/or micromachining, for example. Various other fabrication techniques are contemplated.

The multiple degree of freedom actuator may be formed of silicon (e.g., single crystal silicon and/or polycrystalline silicon). The multiple degree of freedom actuator may be formed of various semiconductor materials such as silicon, germanium, diamond, and/or gallium arsenide. The material of which the multiple degree of freedom actuator is formed may be doped to obtain a desired conductivity thereof. The multiple degree of freedom actuator may be formed of a metal such as tungsten, titanium, germanium, aluminum, and/or nickel. Any desired combination of these and other materials may be used.

Motion control of the multiple degree of freedom actuator and/or items moved by the multiple degree of freedom actuator is disclosed in accordance with various embodiments. The motion control may be used to facilitate a desired movement of an item while mitigating undesired movement of the item. For example, the motion control may be used to facilitate movement of a lens along an optical axis of the lens, while inhibiting other movements of the lens. Thus, the motion control may be used to provide focusing and/or zoom by facilitating movement of the lens in single desired translational degree of freedom while inhibiting movement of the lens in all other translational degrees of freedom and while inhibiting movement of the lens in all rotational degrees of freedom.

In another example, the motion control may facilitate movement of the lens in all three translational degrees of freedom while inhibiting movement of the lens in all three rotational degrees of freedom. For example, focusing and/or zoom, as well as optical image stabilization, may be facilitated by providing movement of the lens in all three translational degrees of freedom while inhibiting movement of the lens in all three rotational degrees of freedom.

Thus, an enhanced miniature camera for standalone use and for use in electronic devices may be provided. The miniature camera is suitable for use in a wide variety of different electronic devices. For example, the miniature camera is suitable for use in electronic devices such as cellular telephones, laptop computers, televisions, handheld devices, tablets, car cameras, web cams, and surveillance devices.

According to various embodiments, smaller size and enhanced shock resistance are provided. Enhanced shock resistance can result from the smaller size (and the consequent lower mass) of the miniature camera and its components. Enhanced shock resistance can result from features of the multiple degree of freedom actuator discussed herein.

FIG. 1 shows an electronic device 100 having a miniature camera 101 in accordance with an embodiment. The miniature camera 101 can have a multiple degree of freedom actuator 400, such as in a lens barrel 200 thereof. The multiple degree of freedom actuator 400 can facilitate focus, zoom, optical image stabilization and/or optical correction as discussed herein.

In accordance with various embodiments, electronic device may include any type of MEMS device. The MEMS device may include electrical contacts such as sintered electrical contacts having a silver-paste metallization. The electrical contacts on the MEMS device may be connected to other circuitry using any suitable conductive connection such as conductive epoxy, anisotropic conductive adhesive, solder, solder paste, a mechanical connector or other suitable materials or components for coupling to a sintered electrical contact such as a silver-paste-metalized electrical contact.

The electronic device 100 may be a cellular telephone, a laptop computer, a surveillance device, or any other desired device. The miniature camera 101 may be built into the electronic device 100, may be attached to the electronic device 100, or may be separate (e.g., remote) with respect to the electronic device 100. Further descriptions of electronic devices that can include a multiple degree of freedom actuator may be found in U.S. Patent Publication No. 2013/0077168, Filed Sep. 28, 2011, which is incorporated herein by reference in its entirety.

Figure 2:
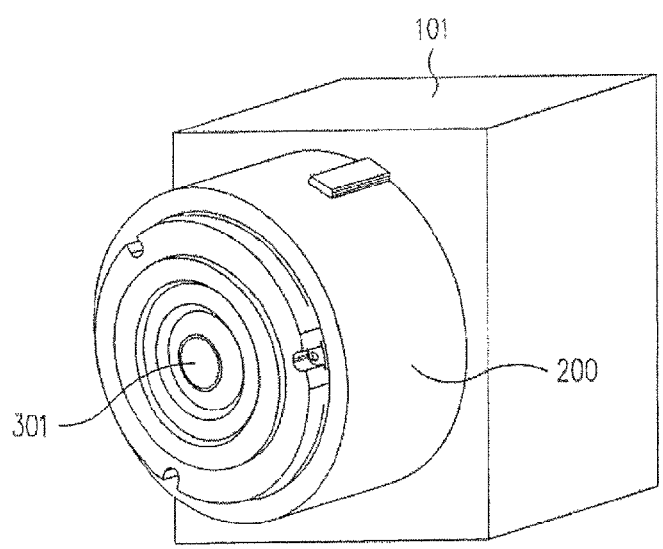
FIG. 2 shows a miniature camera having a lens barrel, in accordance with an embodiment.

FIG. 2 shows the miniature camera 101 having the lens barrel 200 extending therefrom, in accordance with an embodiment. The lens barrel 200 may contain one or more optical elements, such as a movable lens 301, which may be moved by the multiple degree of freedom actuator 400 (see FIG. 5). The lens barrel 200 may have one or more optical elements which may be fixed. For example, the lens barrel 200 may contain one or more lenses, apertures (variable or fixed), shutters, mirrors (which may be flat, non-flat, powered, or non-powered), prisms, spatial light modulators, diffraction gratings, lasers, LEDs and/or detectors. Any of these items may be fixed or may be movable by the multiple degree of freedom actuator 400.

The multiple degree of freedom actuator 400 may be used in non-camera applications. The multiple degree of freedom actuator 400 may be used to move either optical or non-optical devices in various applications. For example, the multiple degree of freedom actuator 400 may be used to move samples that are provided for scanning. The samples may be either biological samples or non-biological samples.

Examples of biological samples include organisms, tissues, cells, and proteins. Examples of non-biological samples include integrated circuits, MEMS devices, solids, liquids, and gases. The multiple degree of freedom actuator 400 may be used to manipulate structures, light, sound, or any other desired thing.

The optical elements may be partially or fully contained within the lens barrel 200. The lens barrel 200 may have any desired shape. For example, the lens barrel 200 may be substantially round, triangular, rectangular, square, pentagonal, hexagonal, octagonal, or of any other shape or cross-sectional configuration. The lens barrel 200 may be either permanently or removably attached to the miniature camera 101. The lens barrel 200 may be defined by a portion of a housing of the miniature camera 101. The lens barrel 200 may be partially or completely disposed within the miniature camera 101.

Figure 3A:
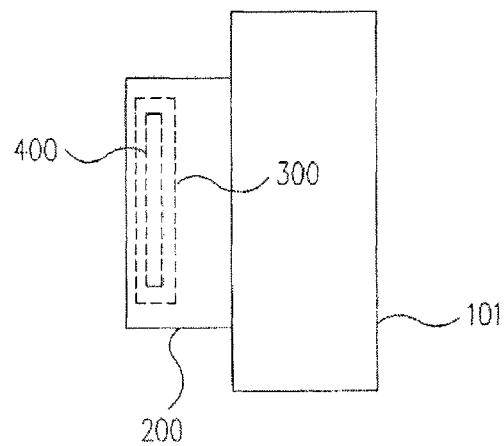
FIG. 3A shows a miniature camera with the lens barrel having the actuator module disposed therein, in accordance with an embodiment.

FIG. 3A shows an actuator module 300 disposed within the lens barrel 200, in accordance with an embodiment. The actuator module 300 may contain the multiple degree of freedom actuator 400. The multiple degree of freedom actuator 400 may be completely contained within the lens barrel 200, partially contained within the lens barrel 200, or completely outside of the lens barrel 200. The multiple degree of freedom actuator 400 may be adapted to move optical elements contained within the lens barrel 200, optical elements not contained within the lens barrel 200, and/or any other desired items.

Figure 3B:
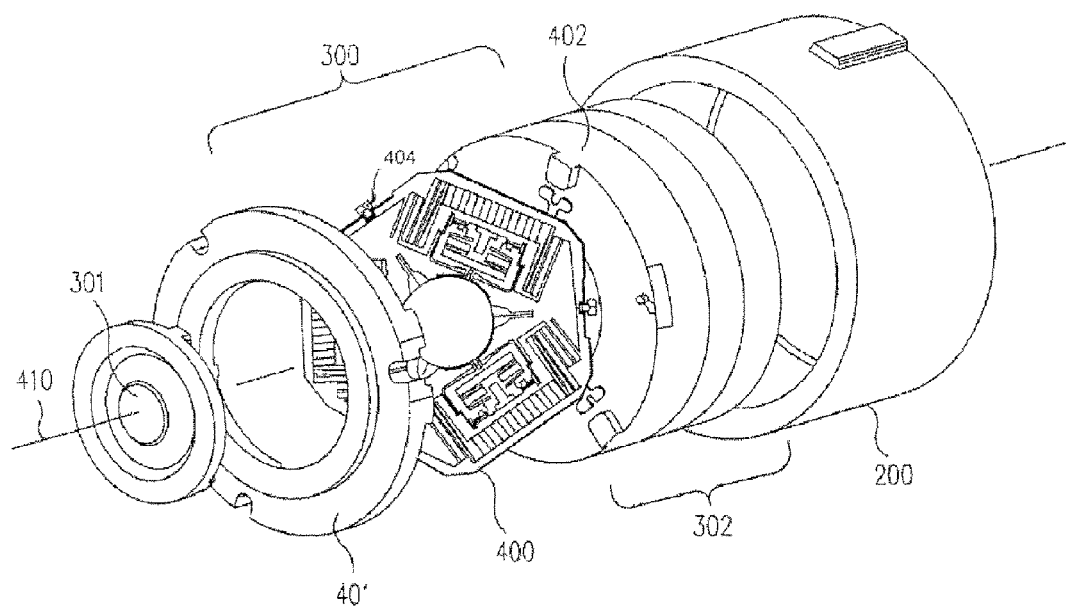
FIG. 3B shows the lens barrel and the actuator module in an exploded view, in accordance with an embodiment.

FIG. 3B shows the lens barrel 200 and the actuator module 300 in an exploded view, in accordance with an embodiment. The movable lens 301 is an example of an optical element that may be attached to or in mechanical communication with the multiple degree of freedom actuator 400 and may be moved thereby. The movable lens 301 can be moved along an optical axis 410 of the miniature camera 101 to facilitate focus and/or zoom, for example. The multiple degree of freedom actuator 400 may be disposed between an upper module cover 401 and a lower module cover 402.

Additional optical elements, such as fixed (e.g., stationary) lenses 302 may be provided. The additional optical elements may facilitate focus, zoom, and/or optical image stabilization, for example. Any desired number and/or type of movable (such as via the multiple degree of freedom actuator 400) and fixed optical elements may be provided.

As shown in FIG. 3B, actuator 400 may include one or more electrical contacts 404 for providing control signals such as control voltages and/or reference voltages to actuator 400. In one embodiment, actuator 400 includes three electrical contacts 404 (e.g., a positive control voltage contact, a reference voltage contact, and a third, unused contact). However, this is merely illustrative. In various embodiments, actuator 400 may include any suitable number of electrical contacts 404 for providing control signals or any other signals to or from actuator 400. In an embodiment, electrical contacts 404 are sintered electrical contacts such as silver-paste-metalized electrical contacts. Silver paste on contacts 404 may have a composition that is suitable for conductive attachment to, for example, voltage supply lines (e.g., lead lines from lens barrel 200) using conductive epoxy. Further descriptions of actuators with electrical contacts that may be metalized using silver paste may be found in U.S. Patent Publication No. 2012/0120507, Filed Nov. 15, 2010, which is incorporated herein by reference in its entirety.

Figure 4:
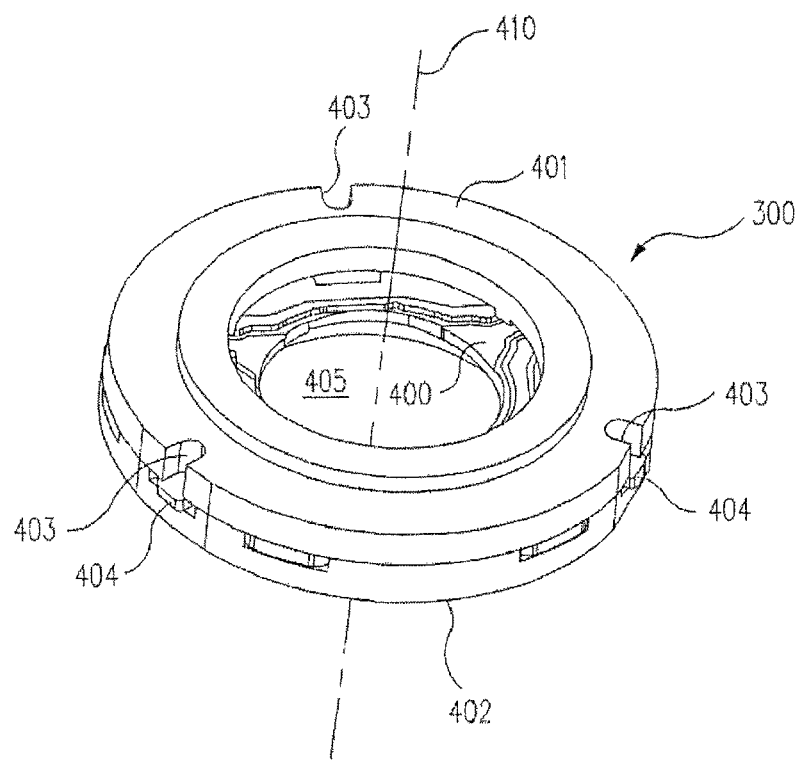
FIG. 4 shows the actuator module having the multiple degree of freedom actuator disposed therein, in accordance with an embodiment.

FIG. 4 shows the actuator module 300, in accordance with an embodiment. The actuator module 300 may be disposed partially or completely within the miniature camera 101. The multiple degree of freedom actuator 400 may be disposed partially or completely within the actuator module 300. For example, the multiple degree of freedom actuator 400 may be sandwiched substantially between an upper module cover 401 and a lower module cover 402.

The actuator module 300 may have any desired shape. For example, the actuator module 300 may be substantially round, triangular, square, rectangular, pentagonal, hexagonal, octagonal, or of any other shape or cross-sectional configuration.

In an embodiment, the lens barrel 200 may be substantially round in cross-sectional configuration and the actuator module 300 may be substantially round in cross-sectional configuration. The use of a substantially round lens barrel 200 and a substantially round actuator module 300 may facilitate an advantageous reduction in size. The reduction in size may be facilitated, for example, because round lenses are commonly preferred. The use of a substantially round lens barrel 200 and a substantially round actuator module 300 with round lenses tends to result in a reduction of wasted volume and thus tends to facilitate a reduction in size.

As discussed herein, one or more optical elements, such as the movable lens 301, may be disposed in an opening 405 (e.g., a hole) formed in the actuator module 300. The multiple degree of freedom actuator 400 may effect movement of the optical elements along their optical axis 410, for example. Thus, the multiple degree of freedom actuator 400 may move one or more lenses, such as lens 301, to effect focusing or zoom, for example.

The actuator module 300 may have cutouts 403 formed therein to facilitate assembly of the actuator module 300, alignment of the multiple degree of freedom actuator 400 contained therein, and/or electrical connections to contacts 404. The cutouts 403 and/or electrical contacts 404 partially disposed within the cutouts 403 may be used to facilitate alignment of the actuator module 300 with respect to the lens barrel 200.

FIG. 5 shows the multiple degree of freedom actuator 400, in accordance with an embodiment of the invention. The multiple degree of freedom actuator 400 can provide motion controlled movement in six degrees of freedom for used in a variety of applications. The multiple degree of freedom actuator 400 can provide three degrees of linear or translational motion and three degrees of angular or rotational motion.

The multiple degree of freedom actuator 400 can comprise three substantially identical sectors 501. Each sector 501 can comprise both a tangential or in-plane actuator 502 and a Z-motion or out-of-plane actuator 503. The in-plane actuators 502 can be linear electrostatic comb drives, for example. The out-of-plane actuators 503 can be rotational electrostatic comb drives, for example. The out-of-plane actuators 503 can be linear, e.g., vertical or 2-axis, electrostatic comb drives, for example. Each of the in-plane actuators 502 and each of the out-of-plane actuators 503 can be independently controllable and movable with respect to one another.

The in-plane actuators 502 and the out-of-plane actuators 503 can control the motion of a platform 504. The platform 504 can define a lens ring and can be used to mount one or more lenses. For example, the platform 504 can mount the lens 301, which can be a focusing lens and/or a zoom lens. The platform 504 can be moved in all six degrees of freedom.

Since the platform 504 can be moved in all six degrees of freedom, it can facilitate focus, zoom, optical image stabilization, optical element alignment, and/or optical correction for example. Focus and/or zoom can be facilitated by translating one or more lenses along a z-axis. Optical image stabilization and/or optical element alignment can be facilitated by translating one or more lenses or another optical element within an x-y plane and/or by rotating the lens or other optical element(s) about an x-axis and/or a y-axis.

Although FIG. 5 shows the multiple degree of freedom actuator 400 as having three in-plane actuators 502, the multiple degree of freedom actuator 400 can have any number of in-plane actuators 502. For example, the multiple degree of freedom actuator 400 can have one, two, three, four, five, six, or more in-plane actuators 502.

Each in-plane actuator 502 can provide tangential movement of the platform 504. That is, each in-plane actuator 502 can move a point 511 on a periphery of the platform 504 in a direction that is substantially tangential with respect to the periphery of the platform 504, as indicated by arrow 512.

All of the in-plane actuators 502 can cooperate to provide translational movement of the platform 504 within the x-y plane (within the plane of the multiple degree of freedom actuator 400). Such x-y plane movement of the platform 504 can be used to translate the lens 301 for optical image stabilization or alignment, for example.

All of the in-plane actuators 502 can cooperate to provide z-axis rotational movement of the platform 504. Such z-axis rotational movement can be used to rotate a direction sensitive optical element, such as a polarizer or a diffraction grating, for example.

Although FIG. 5 shows the multiple degree of freedom actuator 400 as having three out-of-plane actuators 503, the multiple degree of freedom actuator 400 can have any number of out-of-plane actuators 503. For example, the multiple degree of freedom actuator 400 can have one, two, three, four, five, six, or more out-of-plane actuators 503.

The out-of-plane actuators 503 can cooperate to provide translational movement of the platform 504 along the z-axis (which is perpendicular with respect to the plane of the multiple degree of freedom actuator 400). Such z-axis movement of the platform 504 can be used to translate the lens 301 for focus and/or zoom, for example. The out-of-plane actuators 503 can cooperate to provide rotational movement of the platform 504 about the x-axis and/or y-axis. Such rotational movement can be used to rotate the lens 301 for optical image stabilization or alignment, for example.

Figure 6:
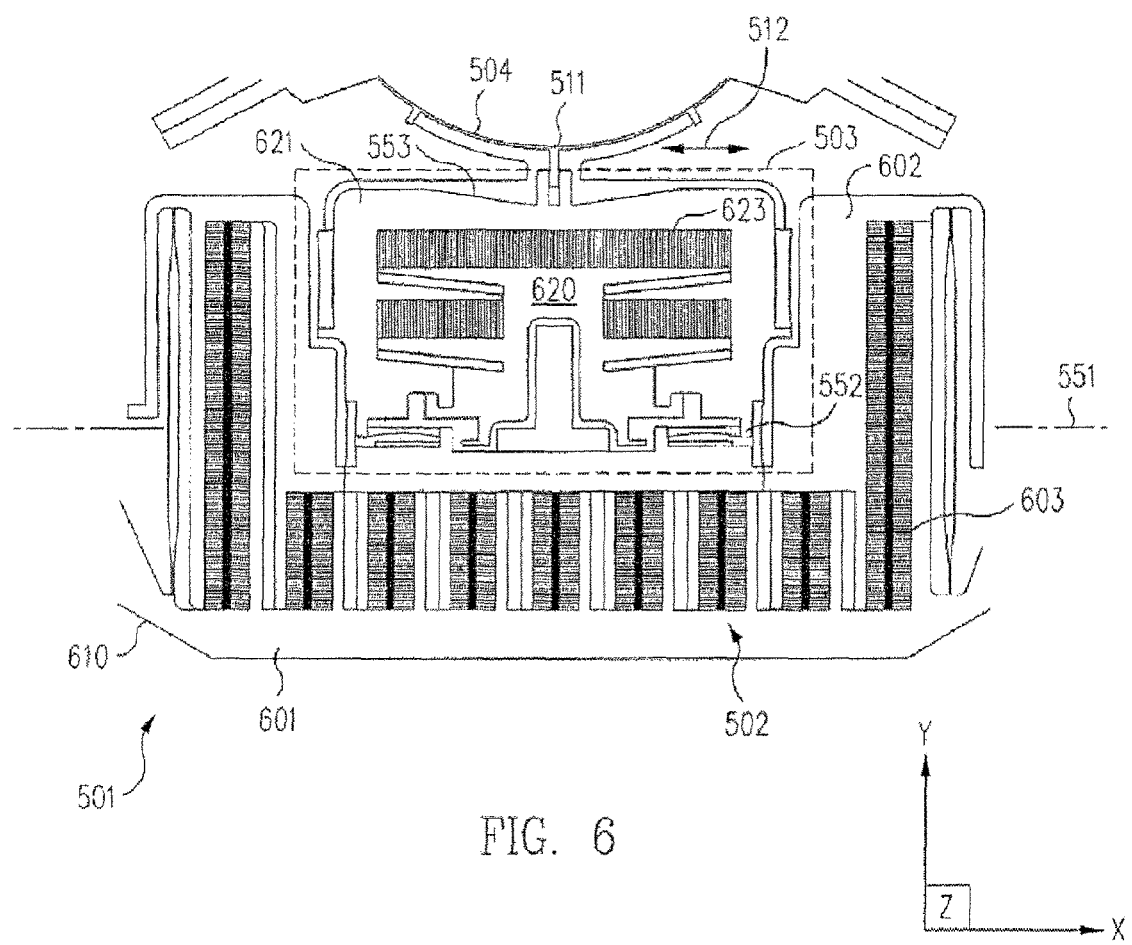
FIG. 6 is an enlarged view showing one sector of the multiple degree of freedom actuator of FIG. 5, in accordance with an embodiment.

FIG. 6 is an enlarged view showing one sector 501 of the multiple degree of freedom actuator 400 of FIG. 5, in accordance with an embodiment of the invention. As shown in FIG. 5, the multiple degree of freedom actuator 400 comprises three sectors 501. The multiple degree of freedom actuator 400 can comprise any desired number of sectors 501. For example, the multiple degree of freedom actuator 400 can comprise one, two, three, four, five, six, or more sectors 501.

The in-plane actuators 502 can each comprise a fixed x-y frame 601 and a movable x-y frame 602. Comb fingers or teeth 603 can extend from the fixed x-y frame 601 and the movable x-y frame 602 and can cooperate to define an electrostatic actuator that effects substantially linear movement of the movable x-y frame 602 with respect to the fixed x-y frame 601. The movable x-y frame 602 moves within the x-y plane. The movable x-y frame 602 moves back and forth in the directions indicated by arrow 512.

The fixed x-y frame 601 of each sector 501 can cooperate to define an outer frame 610 of the multiple degree of freedom actuator 400. The outer frame 610 can substantially rigidly interconnect each of the sectors 501 to one another.

The out-of-plane actuators 503 can each comprise an out-of plane, deployed z-frame 620 and a movable z-frame 621. Comb fingers or teeth 623 can extend from the deployed z-frame 620 and the movable z-frame 621 and can cooperate to define an electrostatic actuator that effects movement of the movable z-frame 621 with respect to the deployed z-frame 620. The movable z-frame 621 rotates so as to provide movement of at least a portion of the platform 504 substantially along the z axis.

The deployed z-frame 620 can be deployed to a position such that the deployed z-frame 620 is angularly disposed with respect to the plane of the multiple degree of freedom actuator 400. That is, the deployed z-frame 620 can be rotated about a hinge line 551 that passes through a proximal portion 552 of the deployed z-frame 620 so as to cause a distal portion 553 of the deployed z-frame 620 to move out of the plane of the multiple degree of freedom actuator 400 and into the deployed position of the deployed z-frame 620. The deployed position of the deployed z-frame 620 can be either above or below (on either side of) the plane of the multiple degree of freedom actuator 400.

Figure 7:
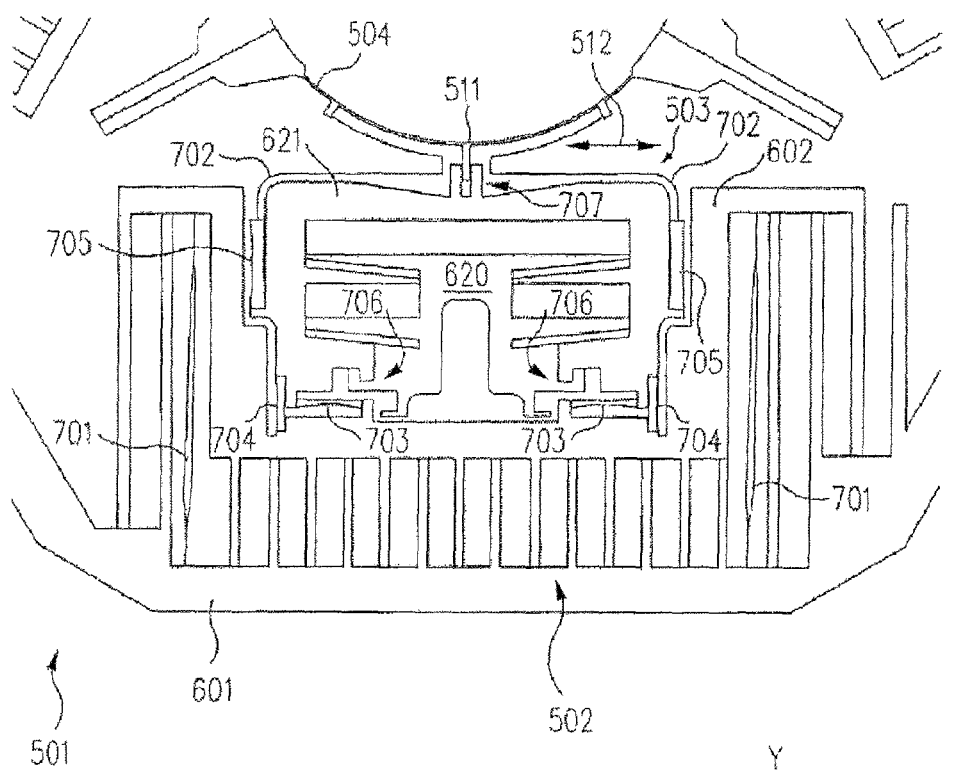
FIG. 7 shows the sector of FIG. 6 with the comb drive teeth removed for clarity, in accordance with an embodiment.

FIG. 7 shows the sector of FIG. 6 with the teeth 603 and 623 removed for clarity, in accordance with an embodiment of the invention. Motion control features can be used to limit the motion of the in-plane actuators 502 and the out-of-plane actuators 503. The motion control features can consequently limit the motion of the platform 504, since the motion of the platform 504 is controlled by the in-plane actuators 502 and the out-of-plane actuators 503.

For example, tangential movement flexures 701, cantilever flexures 702, torsional flexures 703, outer hinge flexures 704, and inner hinge flexures 705 can be used to facilitate motion control.

The tangential movement flexures 701 can facilitate lateral movement of the in-plane actuators 502 so as to provide tangential movement of the platform 504. This can be done while the tangential movement flexures 701 inhibit movement of the in-plane actuators 502 in other degrees of freedom.

The cantilever flexures 702 can transfer z-axis motion of the out-of-plane actuators 503 to the platform 504 while accommodating the varying distance between out-of-plane actuators 503 and the platform 504. This can be done while the cantilever flexures 702 inhibit movement of the out-of-plane actuators 503 in other degrees of freedom.

The torsional flexures 703 can facilitate rotational movement of the movable z-frames 621 of the out-of-plane actuators 503 so as to provide movement of the platform 504 along the z-axis. This can be done while the torsional flexures 703 inhibit movement of the movable z-frames 621 in other degrees of freedom. In particular, the torsional flexures 703 inhibit movement of the movable z-frames 621 along the x axis.

The outer hinge flexures 704 can facilitate rotational movement of the movable z-frame 621 of the out-of-plane actuators 503 so as to provide movement of the platform 504 along the z-axis. This can be done while the outer hinge flexures 704 inhibit movement of the movable z-frame 621 in other degrees of freedom. In particular, the outer hinge flexures inhibit movement of the y direction.

The inner hinge flexures 705 can facilitate rotational movement of the out-of-plane actuators 503 as the cantilever flexures 702 transfer z-axis motion of the out-of-plane actuators 503 to the platform 504. This can be done while the inner hinge flexures 705 inhibit movement of the platform 504 in other degrees of freedom.

Each of the out-of-plane actuators 503 can have two proximal lateral snubber assemblies 706 and one distal lateral snubber assembly 707 to provide further motion control, for example. The proximal lateral snubber assemblies 706 can inhibit lateral movement of the movable z-frame 621 with respect to the deployed z-frame 620. The distal lateral snubber assembly 707 can inhibit later movement of the platform 504 with respect to the movable z-frame 621.

Figure 8:
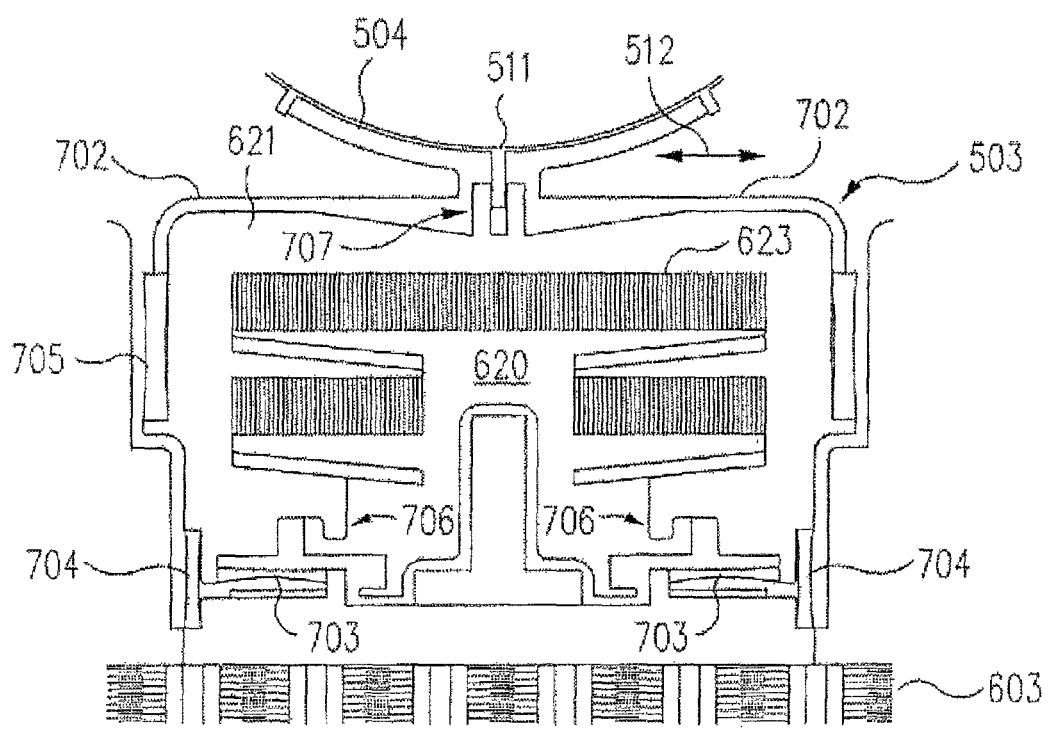
FIG. 8 is an enlarged view showing the out-of-plane actuator of FIG. 7, in accordance with an embodiment.

FIG. 8 is an enlarged view showing the out-of-plane actuator of FIG. 7, in accordance with an embodiment of the invention. The teeth 603 of the in-plane actuators 502 and the teeth 623 out-of-plane actuators 503 are shown.

Figure 9:
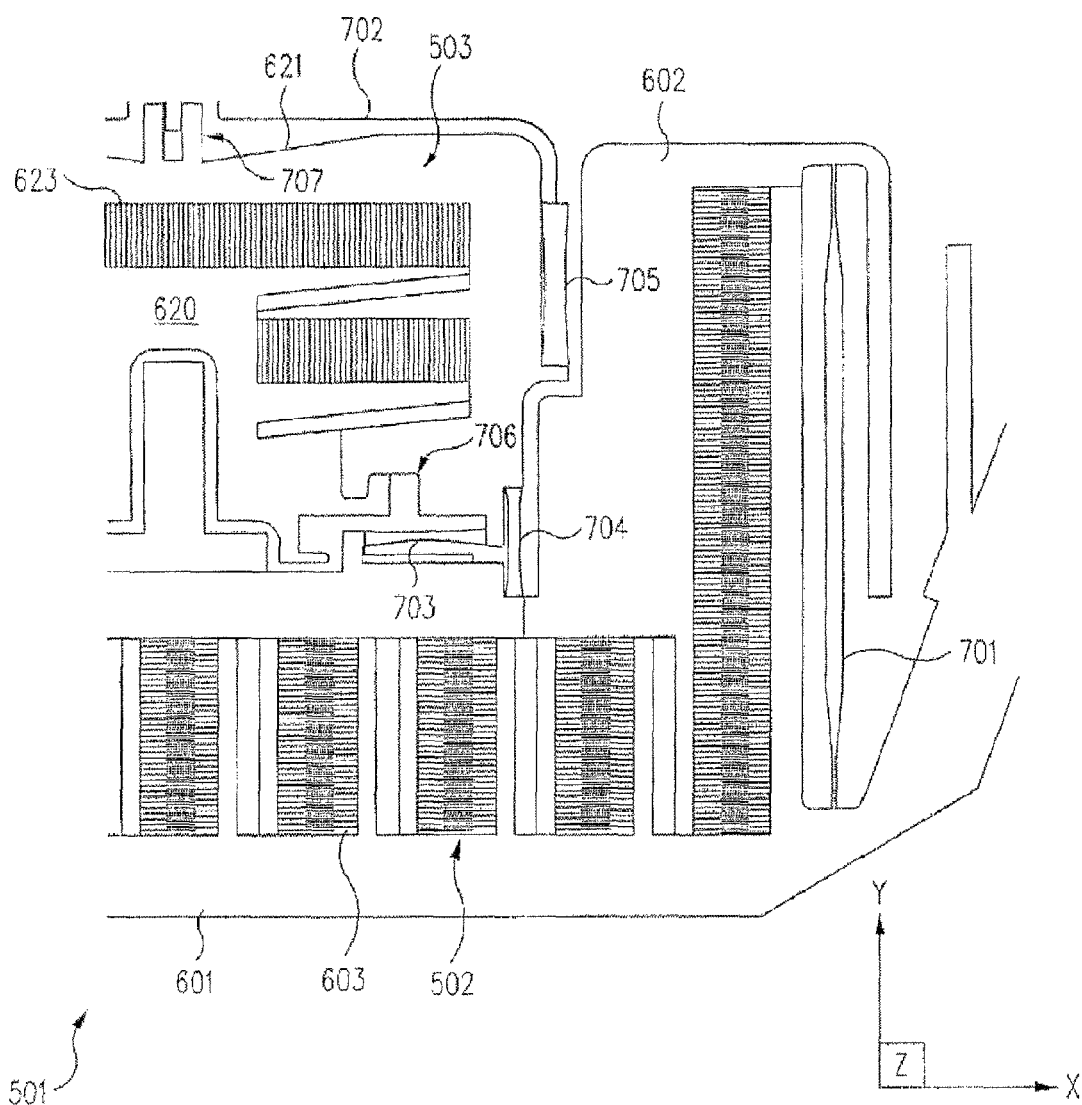
FIG. 9 is an enlarged view showing a portion of the in-plane actuator and a portion of the out-of-plane actuator of FIG. 6, in accordance with an embodiment.

FIG. 9 is an enlarged view showing a portion of the in-plane actuator of FIG. 9, in accordance with an embodiment of the invention. Some of the motion control features can be more clearly seen in this view. For example, one of the tangential movement flexures 701, one of the cantilever flexures 702, one of the torsional flexures 703, one of the outer hinge flexures 704, and one of the inner hinge flexures 705 can be more clearly seen.

In operation, the three out-of-plane actuators 503 can move in unison to translate one or more lenses and thus facilitate focus and/or zoom. The three out-of-plane actuators 503 can move independently to rotate one or more lenses to facilitate optical image stabilization or alignment of the lens(es). The three in-plane actuators 502 can move independently to translate one or more lenses or another optical element to facilitate optical image stabilization or alignment of the lens(es) or optical element.

Any of the in-plane actuators 502 and the out-of-plane actuators 503 can be biased or moved to a given position that can be considered a zero or centered position. The centered position can be anywhere along the range of travel for the in-plane actuators 502 and the out-of-plane actuators 503. The centered position can be an aligned position of the lens(s) or other optical elements. The in-plane actuator(s) 502 and/or the out-of-plane actuator(s) 503 can remain in this centered position until driven to a different position to effect focus, zoom, or optical image stabilization.

The state or position of each of the in-plane actuators 502 and each of the out-of-plane actuators 503 can be controlled by providing a control signal or voltage thereto. Generally, higher voltages will result in greater movement of the in-plane actuators 502 and the out-of-plane actuators 503.

Figure 10:
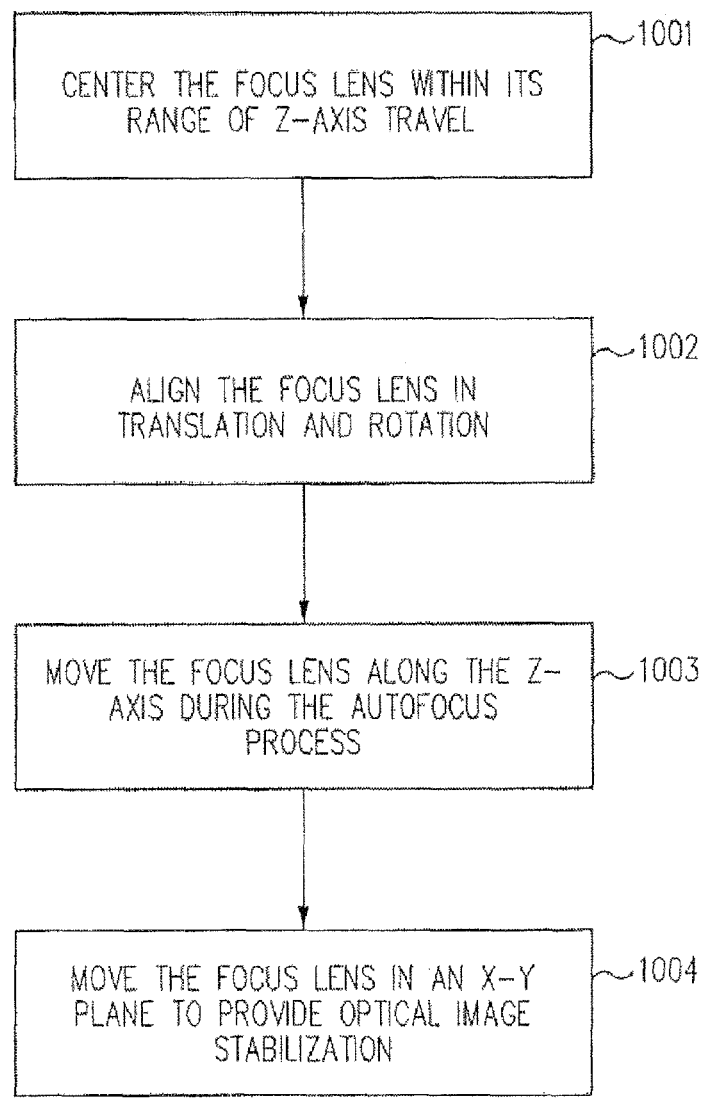
FIG. 10 is a flow chart showing an example of operation of the multiple degree of freedom actuator, in accordance with an embodiment.

FIG. 10 is a flow chart showing an example of operation of the multiple degree of freedom actuator 400, in accordance with an embodiment of the invention. On power up of the electronic device 100 and/or the miniature camera 101, the in-plane actuators 502 and/or the out-of-plane actuators 503 can move the lens 301 to an aligned position proximate a center of travel of the lens 301.

More particularly, the out-of-plane actuators 503 can move the lens to a position proximate the center of travel of the lens 301, as indicated in block 1001 and the in-plane actuators 502 can cooperate with the out-of-plane actuators 503 to align the lens in all six degrees of freedom, as indicated in block 1002.

During an autofocus process, the lens 301 can be moved by the out-of-plane actuators 503 to a position that provides a desired focus of the miniature camera 101, as indicated in block 1003. This movement can be accomplished while maintaining the alignment of the lens 301.

During an optical image stabilization process, the in-plane actuators 502 and/or the out-of-plane actuators 503 can cooperate to move the lens 301 in a manner that provides optical image stabilization as indicated in block 1004. Aligning the lens 301, focusing with the lens 301, and providing optical image stabilization with the lens 301 can occur serially, in parallel with one another, or partially serially and partially in parallel (e.g. can overlap) with one another.

With reference to FIGS. 11-15, electrical routing and contact is discussed, in accordance with several embodiments. Such electrical routing may be used to conduct electrical signals (e.g., control voltages) from the lens barrel 200 to the actuator 400 in order to facilitate focusing, zooming, and/or optical image stabilization, for example.

Figure 11:
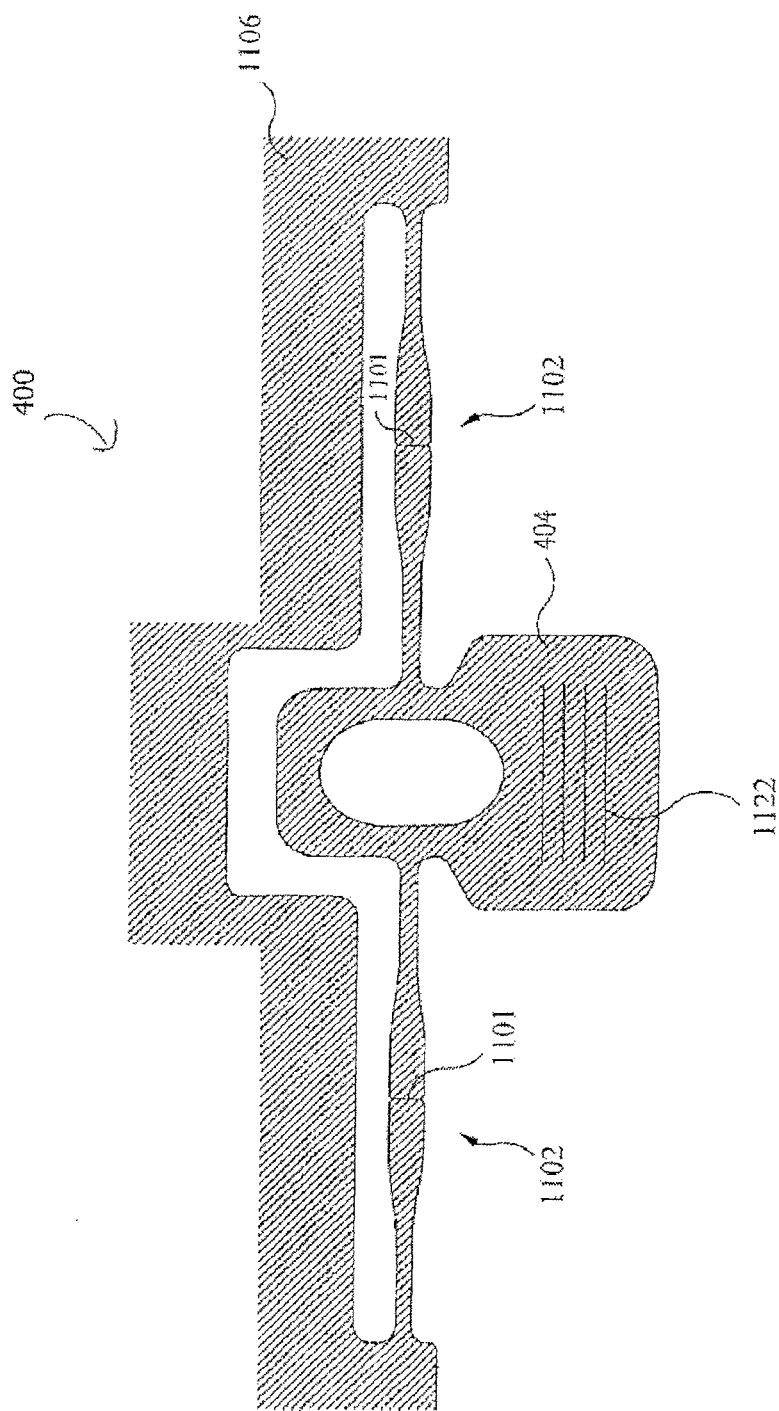
FIG. 11 illustrates a kinematic mount flexure having an electrical contact, in accordance with an embodiment.

FIG. 11 illustrates a top view of an electrical contact 404. As shown in FIG. 11, electrical contact 404 may be attached to an outer frame portion 1106 of actuator 400 by kinematic mount flexures 1102, in accordance with an embodiment. In various embodiments, the kinematic mount flexures 1102 and the electrical contact 404 may be formed from a single crystalline substrate, a single crystalline substrate having a layer of polysilicon formed thereon, various semiconductor materials such as silicon, germanium, diamond, and/or gallium arsenide, doped conductive materials, alloys and/or metals such as tungsten, titanium, germanium, aluminum, and/or nickel.

The electrical contact 404 and the kinematic mount flexure 1102 may facilitate mounting of the actuator device 400, such as within a lens barrel 200, as discussed herein. The electrical contact 404 and the kinematic mount flexure 1102 may facilitate electrical communication between the lens barrel and actuators such as actuators 502 and/or 503 of the actuator device, as discussed herein. The flexures 1102 may, for example, accommodate manufacturing imperfections or tolerances of the actuator device 400 and/or the lens barrel 200 while mitigating stress upon the actuator device 400 caused by such imperfections.

According to an embodiment, electrical connection may be made to either desired surface (e.g., top or bottom) of the electrical contact 404. Electrical contacts on a MEMS device such as electrical contacts 404 of actuator 400 may be provided with a conductive contact pad on one or more surfaces as described below in connection with, for example FIGS. 12 and 13.

A voltage may be applied to actuators such actuators 502 and 503 via the electrical contacts 404. For example, two of the three contacts 404 may be used to apply a voltage from the lens barrel 200 to the actuator 400. The third contact 404 may be unused or may be used to redundantly apply one polarity of the voltage from the lens barrel 200 to the actuator 400.

Voltages may be applied to actuators such as actuators 502 and/or 503 using voltages supplied to contacts 404 that result in translation of the platform 504 (e.g., motion of the platform such that the platform 504 remains substantially parallel to an outer frame, thereby maintaining alignment of, for example, an optical element such as the movable lens 301 as the optical element is moved, such as along an optical axis 410) and/or tilting of the platform 504 (e.g., motion of the platform such that the platform tilts substantially with respect to the outer frame, thereby aligning the platform 504 to the outer frame, facilitating optical image stabilization, or lens alignment).

In some embodiments, trenches 1101 may be formed in the kinematic mount flexures 1102 and trenches 1122 may be formed in the electrical contact 404. However, this is merely illustrative. If desired, flexures 1102 and/or electrical contact 404 may be formed without trenches. Trenches 1101 and/or 1122 may, for example, be polysilicon trenches in a single crystalline substrate.

In embodiments in which kinematic mount flexures are provided with trenches, the trenches 1101 may be formed substantially in a center of each kinematic mount flexure 1102 and may be formed substantially perpendicular to a length of the kinematic mount flexures 1102, for example. The trenches 1101 may be adapted such that the trenches 1101 are suitable to electrically isolate a first portion of the kinematic mount flexure 1102 on one side of the trench 1101 from a second portion of the kinematic mount flexure 1102 on the other side of the trench 1101. Thus, in one embodiment, the application of a voltage to electrical contact 404 on one side of the trench 1101 does not substantially affect the kinematic mount flexure 1102 on the other side of the trench 1101.

As shown in FIG. 11, electrical contact 404 may include an opening such as opening 1104 formed at least partially between kinematic mount flexures 1102 for that contact 404. As described further in U.S. patent application Ser. No. 14/042,214 which is incorporated herein by reference in its entirety, kinematic mount flexures and electrical contacts such as kinematic mount flexures 1102 and electrical contact 404 may comprise a single crystalline substrate having a layer of polysilicon formed thereon.

In some embodiments, the single crystalline substrate may be electrically isolated from the polysilicon, so as to facilitate a communication of different voltages thereby. For example, the single crystalline substrate may be used to communicate one voltage to an actuator and the polysilicon may be used to communicate another voltage to the same actuator to effect actuation thereof.

In some embodiments, at least some portions of the single crystalline substrate may be in electrical communication with the polysilicon, so as to facilitate the communication of voltage therebetween. For example, the single crystalline substrate and the polysilicon of one or more electrical contacts 404 may be in electrical communication with one another such that an electrical connection may be made to either the top (polysilicon) or the bottom (single crystalline substrate) of the electrical contact 404 with the same effect.

For example, one voltage may be applied to an electrical contact 404 and may be routed to the actuator via the polysilicon formed upon the actuator device and may be isolated from the single crystalline substrate from which the actuator device is formed. The polysilicon trenches may prevent shorting of a voltage applied to the electrical contact 404 with respect to the single crystalline substrate of the actuator device.

The kinematic mount flexures 1102 may be mechanically continuous. Thus, the kinematic mount flexures 1102 may facilitate mounting of the actuator device to a lens barrel 200 as discussed herein, for example.

The polysilicon trenches 1122 may be formed in the electrical contact 404 to provide electrical communication through the electrical contact 404. Thus, a voltage applied to one side of the electrical contact 404 may be provided to the other side of the electrical contact 404. Any desired number of the polysilicon trenches 1122 may be formed in the electrical contact 404.

The use of such trenches 1101 and 1122 may provide substantial flexibility in the routing of voltages, such as through the actuator device for the actuation of the actuators thereof, for example. The use of through-the-thickness (top to bottom) polysilicon filled trenches 1122 may provide flexibility in the routing of voltages from one surface of the actuator device 400 to the other surface thereof. Such trenches 1122 may be used at any desired location and are not limited in location to the electrical contacts 404.

In accordance with an embodiment, a single polysilicon trench 1122 may be formed in the electrical contact 404 such that the polysilicon trench 1122 extends completely through the electrical contact 404 and does not completely cross the electrical contact 404 (e.g., such that the polysilicon trench 1122 does not separate the electrical contact 404 into two electrically isolated portions). The polysilicon trench 1122 may be used to provide electrical communication between surfaces of the electrical contact. For example, the polysilicon trench 1122 may be used to provide electrical communication between a top surface and a bottom surface of the electrical contact 404.

In accordance with an embodiment, the polysilicon trench 1101 formed in the single crystalline substrate may have an oxide layer formed thereon. The polysilicon may be formed upon the oxide layer. In one embodiment, the single crystalline substrate of the kinematic mount flexure 1102 may be formed of doped single crystalline silicon and the polysilicon may be formed of a doped polysilicon. Thus, the single crystalline substrate of the kinematic mount flexure 1102 and the polysilicon of the kinematic mount flexure 1102 may both be at least partially conductive and may be used to route voltages (such as to the actuators, for example). The oxide layer may electrically isolate the polysilicon from the single crystalline substrate of the kinematic mount flexure 1102.

An undercut may be formed in the trench 1101 by removing a portion of the oxide layer. The portion of the oxide layer may be removed during an etching process, for example.

In accordance with an embodiment, the polysilicon trench 1122 may have the oxide layer formed thereon. The polysilicon may be formed upon the oxide layer. The electrical contact 404 may be formed of doped single crystalline polysilicon and the polysilicon may be formed of doped polysilicon. Thus, the electrical contact 404 and the polysilicon may be at least partially conductive and may be used to route voltages. The oxide layer may be used to electrically isolate the polysilicon from the electrical contact 404.

A metal contact pad, a silver paste dot or another conductive contact may be in electrical communication with both the polysilicon and the single crystalline silicon. Thus, the conductive contact may be used to apply a voltage to both surfaces (top and bottom) of the electrical contact 404.

Use of the trenches 1101 and 1122 permits use of the conductive contact on either side of the electrical contact 404. Thus, use of the trenches 1101 and 1122 enhances the flexibility of providing voltages to the actuator device.

An undercut may be formed in the trench 1122 by removing a portion of the oxide layer. A portion of the oxide layer may be removed during an etching process, for example.

In accordance with an embodiment, the kinematic mount flexure 1102 may be provided having no polysilicon trench 1101 formed therein and the electrical contact 404 may be provided having no polysilicon trench 1122 formed therein. Thus, the single crystalline silicon substrate, for example, may be electrically and mechanically continuous. According to an embodiment, electrical connection may be made to either desired surface (e.g., top or bottom) of the electrical contact 404.

In accordance with an embodiment, a polysilicon layer may be formed upon the kinematic mount flexures 1102 and/or the electrical contact 404. The polysilicon layer may provide electrical communication from the electrical contact 404 to the actuators, for example.

In accordance with an embodiment, the polysilicon layer may be formed upon an oxide layer to electrically isolate the polysilicon layer from a single crystalline substrate, for example. Thus, an electrical connection providing one voltage to the polysilicon layer may be made via the top of the electrical contact 404 and an electrical connection providing a different voltage to the single crystalline substrate may be made via the bottom of the electrical contact 404.

In accordance with an embodiment, the polysilicon layer may extend over the top surface of the electrical contact 404 and down along at least one side thereof. The polysilicon layer may be electrically isolated from the single crystalline substrate by the oxide layer. A portion of the oxide layer may be etched away during processing, forming an undercut. A metal contact pad, silver paste dot, or other conductive contact may be formed to the single crystalline substrate to facilitate electrical contact therewith.

In accordance with an embodiment. The electrical contact 404 and the kinematic mount flexure 1102 may facilitate mounting of the actuator device, such as within a lens barrel 200, as discussed herein. The electrical contact 404 and the kinematic mount flexure 502 may facilitate electrical communication between the lens barrel and actuators of the actuator device, as discussed herein. The flexures 1102 may, for example, accommodate manufacturing imperfections or tolerances of the actuator device and/or the lens barrel while mitigating stress upon the actuator device caused by such imperfections.

In accordance with an embodiment, the polysilicon layer may be continuous among multiple actuators. Thus, a single electrical signal (e.g., voltage) may readily be applied to multiple actuators to effect substantially identical and substantially simultaneous control thereof. That is, the multiple actuators may tend to move substantially in unison with respect to one another in response to the single electrical signal.

In accordance with an embodiment, the polysilicon layer may be discontinuous among various actuators. Thus, separate electrical signals (e.g., voltage) may readily be applied independently to each of the actuators to effect substantially independent control thereof. That is, multiple actuators may be controlled so as to move substantially in non-unison with respect to one another in response to the different electrical signals.

In accordance with several embodiments, separated MEMS structures may be provided. Separated structures may be used to provide mechanical and/or electrical isolation thereof, such as for structures of the actuator device, for example. Structures made of the same material may be separated from one another. Structures made of different materials may be separated from one another. Structures may be separated to facilitate relative motion to one another. Structures may be separated to define a desired device or structure by discarding a separated structure. Structures may be separated to allow different voltages to be present at each structure.

In accordance with an embodiment, a trench in a MEMS device may have a narrow portion or pinch formed therein. The trench may be etched into the substrate. For example, a deep reactive-ion etching (DRIE) process may be used to form the trench. Examples of DRIE processes are disclosed in U.S. patent application Ser. No. 11/365,047, filed Feb. 28, 2002, and in U.S. patent application Ser. No. 11/734,700, filed Apr. 12, 2007 all of which are incorporated herein by reference in their entirety.

In one embodiment, the trench may be etched part of the way from the top of the substrate to the bottom thereof. In another embodiment, the trench may be etched completely through the substrate (e.g., all of the way from the top of the substrate to the bottom thereof). A bottom portion of the substrate through which the trench does not extend may be removed during subsequent processing. The trench may have any desired length. The trench, as well as any other trench discussed herein, may be locally etched, such as via the DRIE process.

A gap may be defined by the pinch. The pinch may be formed on either one side or both sides of the trench. The gap may be defined as a portion of the trench that is narrower than adjacent portions of the trench.

The trench, including the gap, may taper slightly from top to bottom. A taper angle may result from the DRIE process when the trench is etched into the substrate. In one embodiment, the taper angle may be less than one degree. For example, the taper angle may be in the range of approximately 0.6 to approximately 0.8 degrees.

A bottom portion of the substrate defined beyond the bottom of the trench may be removed during subsequent processing such that after removal the trench extends completely through the substrate.

In accordance with an embodiment, an oxide layer may be formed within the trench. The oxide layer may comprise silicon dioxide, for example. In one embodiment, the oxide layer may be formed by a thermal growth process. The oxide layer may substantially fill the gap. The oxide layer may completely fill the gap. By filling the gap, the oxide layer facilitates the separation of a subsequently formed polysilicon material into two separate portions thereof.

In accordance with an embodiment, the oxide defines four regions. The oxide layer separates the substrate into two regions and separates the trench into two regions (each of which may be filled with polysilicon), as discussed in further detail herein.

In accordance with an embodiment, a second semiconductor material, such as a polysilicon, may be formed upon the oxide layer. Thus, the substrate and the material with which the trench is filled may comprise a first semiconductor material and a second semiconductor material. The first semiconductor material and the second semiconductor material may be the same semiconductor materials or may be different semiconductor materials. The first semiconductor material and the second semiconductor material may be any desired semiconductor materials. Non-semiconductor materials may be used as discussed herein.

In accordance with an embodiment, during a wafer thinning process, the bottom portion of the substrate may be removed such that the trench extends completely through the substrate.

In accordance with an embodiment, the taper angle and a consumption of the silicon during the thermal growth process cooperate to separate the polysilicon into two portions. In one embodiment, the separation is at the thinnest part of the trench (e.g., at the pinch).

In accordance with an embodiment, all or a portion of the oxide may be removed.

In accordance with an embodiment, the single crystalline silicon substrate may be separated into two portions and the polysilicon may each be separated into two portions. Each portion of the substrate and each portion of the polysilicon may be mechanically and/or electrically isolated from each other portion thereof. Indeed, each portion of the substrate may be mechanically and/or electrically isolated from each other, and from each portion of the polysilicon. Each portion of the polysilicon may be mechanically and/or electrically isolated from each other, and from each portion of the substrate. Thus, structures made from the same material may be separated from one another and structures made from different material may be separated from one another.

In the embodiments including a pinch, the use of the pinch facilitates the separation of two portions of the polysilicon with respect to one another. In other embodiments, an etch process facilitates the separation of two portions of a polysilicon with respect to one another.

In accordance with an embodiment, a DRIE trench etch process may be used to form a trench in substrate formed from a first semiconductor. In accordance with an embodiment, a thermal oxidation process may be used to form an oxide layer in the trench. The oxide layer may also be formed upon a top of the substrate. In accordance with an embodiment, a polysilicon deposition process may be used to deposit a polysilicon over the oxide layer. The polysilicon may fill the trench and may extend over the entire top of the substrate or over a portion of the top of the substrate.

In accordance with an embodiment, a portion of the polysilicon and a substantially corresponding portion of the oxide layer may be removed, such as by etching (e.g., an oxide etch). The removal of the polysilicon and the oxide layer may form a trough.

In accordance with an embodiment, an etch process such as a pinch off DRIE etch process may result in the formation of a pinch or gap that separates the polysilicon into two portions. At this point in processing, the trench may not extend completely from a top to a bottom of the substrate. The gap may be functionally similar to the pinch. The gap facilitates the separation of portions of the polysilicon from one another.

In accordance with an embodiment, a wafer thinning process may be used to remove a sufficient portion of the bottom of the substrate such that the trench extends completely from the top to the bottom of the substrate.

In accordance with an embodiment, an isotropic oxide etch process may be applied to the substrate. The isotropic oxide etch may be used to remove a portion of the oxide layer. The isotropic oxide etch process may release four structures (i.e., the two portions of the substrate and the two portions of the polysilicon) from each other. Thus, the four structures may be mechanically and/or electrically isolated from one another. The isotropic oxide etch process may be used to selectively release or separate any desired structures or portions of structures from one another.

In accordance with an embodiment, both the single crystalline silicon substrate and the polysilicon may be separated into two portions each. Each of the two portions of the single crystalline substrate may be mechanically and electronically isolated from one another and from each of the two portions of the polysilicon. Each of the two portions of the polysilicon may be mechanically and electrically isolated from one another and from each of the two portions of the single crystalline substrate.

In one embodiment, moving polysilicon structures are separated from stationary polysilicon structures and stationary single crystalline structures. Advantage may be taken of the mechanical separation of the moving polysilicon structures with respect to the stationary polysilicon structures to facilitate movement of the moving polysilicon structures with respect to the stationary polysilicon structures. Advantage may be taken of the electrical separation of the moving polysilicon structures with respect to the stationary polysilicon structures to facilitate the application of different voltages to the moving polysilicon structures and the stationary polysilicon structures.

In accordance with an embodiment, a silicon fillet may fall off or be removed from the actuator device during fabrication thereof and thus may not form a part thereof. The silicon fillet is material that is removed from the single crystalline substrate to form the actuator device. After etching, the moving polysilicon will be free to move with respect to the stationary polysilicon. Thus, the moving polysilicon will be separated from the stationary polysilicon.

A guard trench may be provided, in accordance with several embodiments. The guard trench may be used for supporting a polysilicon layer during the etching of an oxide layer and for limiting the resulting etch of the oxide layer behind the guard trench, for example. In one embodiment, the guard trench may be a blind trench that provides an increased path length of the oxide layer to be etched such that the etch is inhibited from extending to portions of the oxide layer where etching is not desired. The use of the guard trench permits a larger tolerance or variation in etch parameters (such as echant, echant concentration, temperature, duration) without the variation undesirably affecting device operation or performance.

In accordance with an embodiment, a guard trench may be formed proximate a regular trench in a substrate. The regular trench may provide any designed function. For example, the polysilicon in the trench may concentrate voltages across the actuator device to one or more actuators. The guard trench may be deeper than the regular trench, the same depth as the regular trench, or shallower than the regular trench. The guard trench may be substantially parallel with respect to the regular trench or may be non-parallel with respect to the regular trench. The guard trench and/or the regular trench may be formed by a DRIE process or by any other desired method.

In accordance with an embodiment, the oxide layer may comprise silicon dioxide and may be formed by a thermal oxidation process. In accordance with an embodiment, the polysilicon may completely fill the guard trench and/or the regular trench.

In accordance with an embodiment, during surface etching, a portion of the oxide layer and the polysilicon may be removed from the top surface of the substrate. For example, a portion of the oxide layer and the polysilicon may be removed from the top surface of the substrate to facilitate a desired routing of voltages upon a surface of an actuator device.

In accordance with an embodiment, during a wafer thinning process, a bottom portion of the substrate may be removed. Removal of the bottom portion of the substrate may result in the regular trench and/or the guard trench extending from a top surface of the substrate to a bottom surface of the substrate. For example, removal of the bottom portion of the substrate may result in the regular trench extending from the top surface of the substrate to the bottom surface of the substrate and the guard trench not extending from the top surface of the substrate to the bottom surface of the substrate. Thus, the guard trench may be a blind trench and the regular trench may be a through trench, for example.

In accordance with an embodiment, after an isotropic etch, a portion of the polysilicon may be released by the formation of an undercut. The guard trench may inhibit the undercut from propagating to the regular trench such that the polysilicon proximate the regular trench is not released from the substrate and thus remains substantially attached thereto. In this manner, the guard trench tends to protect the regular trench from undesirable undercut and release.

In one embodiment, the guard trench is formed proximate the regular trench in the substrate, the guard trench is irregular (e.g., curved) in shape and not parallel to the regular trench. The guard trench tends to maintain the oxide layer in an area upon the substrate where the oxide layer is used to connect a flexure, such as a deployment torsional flexure, or after flexure.

Figure 12:
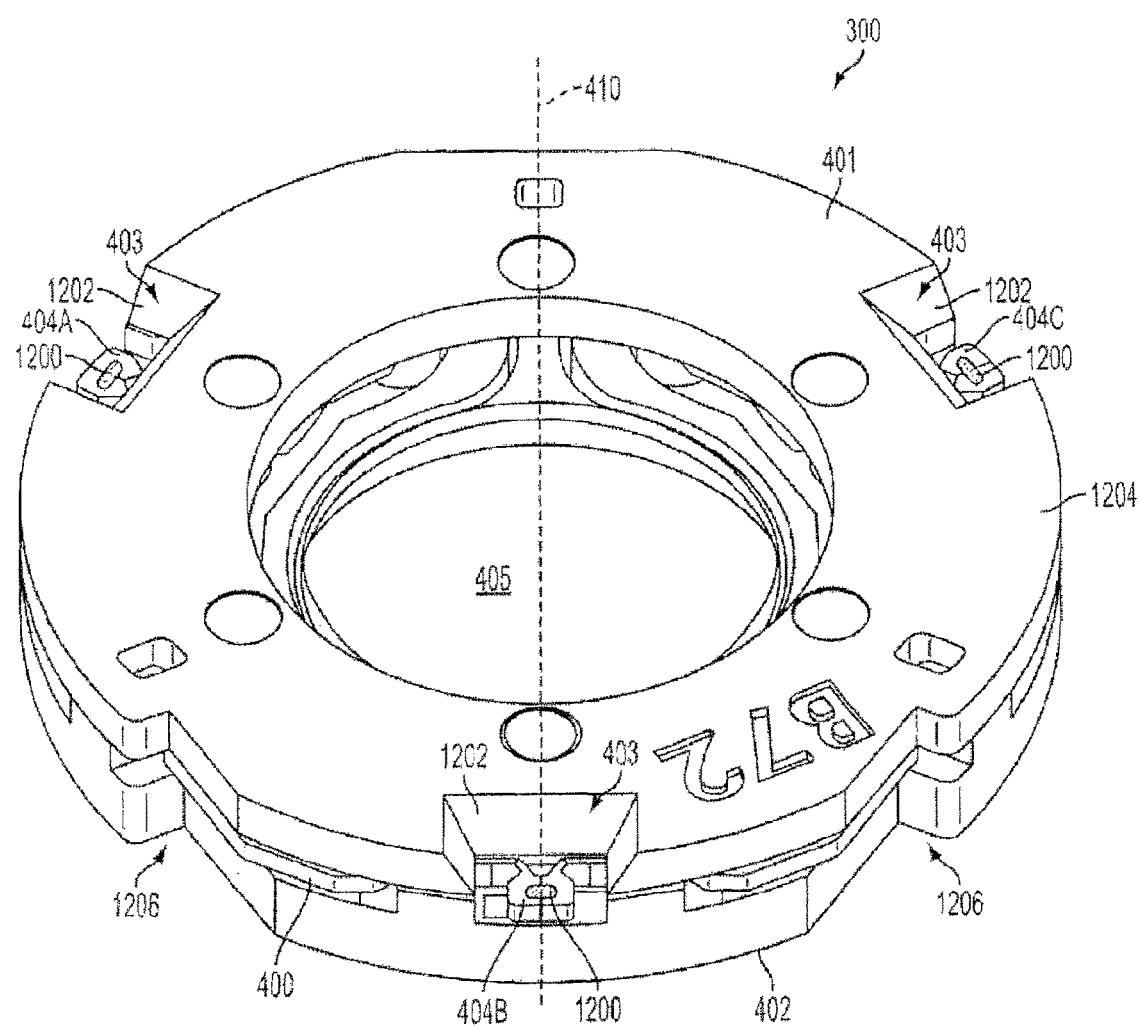
FIG. 12 shows another embodiment of the actuator module having the multiple degree of freedom actuator disposed therein, in accordance with an embodiment.

FIG. 12 shows another embodiment of actuator module 300. In the example of FIG. 12, cutouts 403 in upper module cover 401 include surfaces 1202 that are formed at an obtuse angle with respect to top surface 1204 of upper module cover 401. However, this is merely illustrative. Cutouts 403 may be formed in any suitable shape for facilitating electrical connection to electrical contacts 404.

Electrical contacts 404 may be metalized electrical contacts such as silver-paste-metalized electrical contacts or other electrical contacts formed by sintering material onto a substrate of a MEMS device. In the example of FIG. 12, actuator module 300 includes three electrical contacts 404A, 404B, and 404C, each having silver paste 1200 on the electrical contact. Electrical contacts such as electrical contacts 404A, 404B, and 404C for one or more embodiments may be provided with a silver paste dot, may be substantially covered in silver paste, or may be otherwise metalized using silver paste according to various embodiments.

In this example, electrical contact 404A may be configured to be connected to one or more leads (e.g., control leads) that, during operation of actuator 400, supply a control voltage such as a positive control voltage to contact 404A, electrical contact 404B may be configured to be attached to a lead (e.g., a reference lead) that, during operation of actuator 400, supplies a reference voltage such as a ground voltage to contact 404B, and electrical contact 404C may be an unused electrical contact (e.g., an electrical contact that, in an assembled product, is substantially free of electrical connections to external circuitry). Unused electrical contacts such as contact 404C may be sintered electrical contacts such as silver-paste metalized or may be non-metalized contacts. Unused contacts 404C may be identified by a chamfered corner (not shown) on the contact or on module covers 401 and/or 402. In an assembled product, the lens barrel may have electrical leads for providing the reference voltage and the control voltage to contacts 404. Each electrical lead may include a first end that is connected to a silver paste dot on an electrical contact 404 (e.g., using conductive epoxy) and an opposing second end that is connected to the lens barrel.

As shown in FIG. 12, in some embodiments, upper module cover 401 and lower module cover 402 may have additional cutouts 1206 on outer edges of the module covers. Cutouts 1206 may define a circumferential shape for module 300 and may help facilitate alignment of the actuator module 300 with respect to the lens barrel 200.

It should be appreciated that the example of FIG. 12 is merely illustrative. In various embodiments, actuator 400 may include three electrical contacts, less than three electrical contacts, more than three electrical contacts, more than one unused electrical contact, or no unused electrical contacts. In various embodiments, some or all of the electrical contacts 404 described herein may be sintered electrical contacts such as silver-paste metalized electrical contacts.

Figure 13:
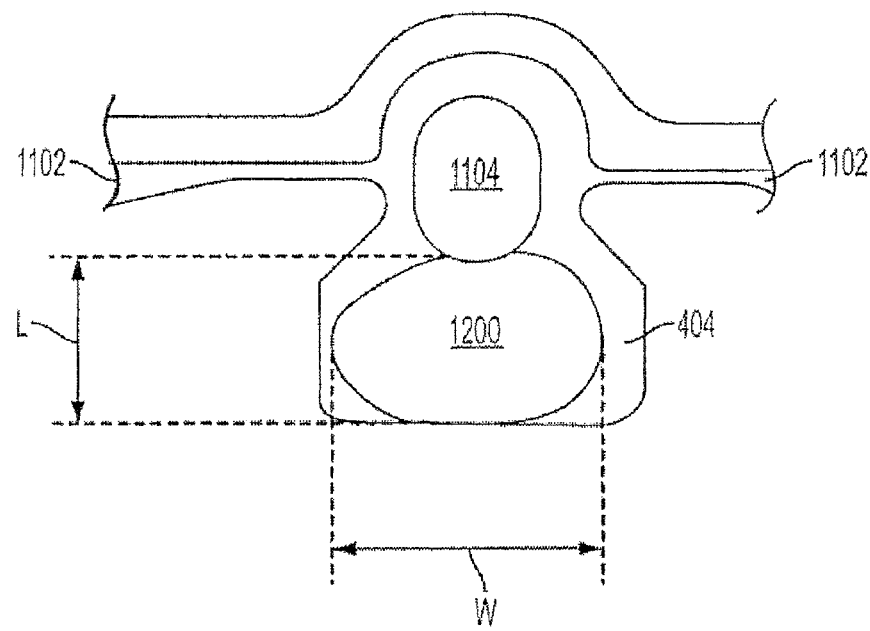
FIG. 13 is an enlarged view showing a sintered electrical contact having a silver paste metallization for coupling to a reference voltage, in accordance with an embodiment.
Figure 14:
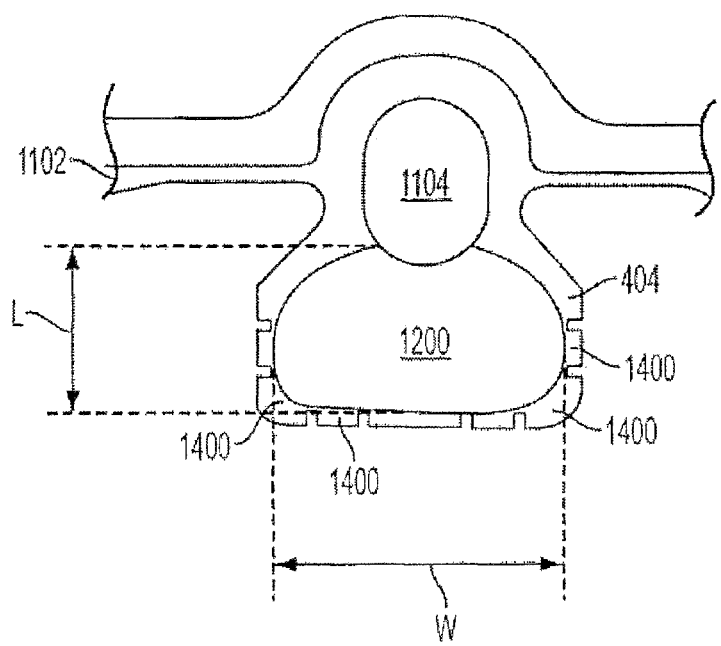
FIG. 14 is an enlarged view showing a sintered electrical contact having a silver paste metallization for coupling to a control voltage, in accordance with an embodiment.

FIGS. 13 and 14 show examples of electrical contacts that have conductive portions formed by sintering a material on the electrical contact. In one suitable embodiment that is sometimes discussed herein as an example, sintered electrical contacts are electrical contacts that have been metalized using silver paste. However, this is merely illustrative. In various embodiments, electrical contacts on a MEMS device may be formed by sintering any suitable material (e.g., a metal powder, a metal ink, a metal preform, or a metal paste such as silver paste) onto a substrate of the MEMS device.

In the example of FIG. 13, silver paste 1200 is provided on a contact 404. Contact 404 of FIG. 13 may, for example, be a contact such as contact 404B of FIG. 12 that is to be connected to an electrical reference voltage (e.g., a ground voltage) for actuator 400. In the example of FIG. 14, silver paste 1200 is provided on a contact 404 having multiple edge segments 1400. Contact 404 of FIG. 14 may, for example, be a contact such as contact 404A of FIG. 12 for coupling to a control voltage such as a positive control voltage. Segments 1400 may be used in accordance with one or more embodiments to identify a particular contact having segments 1400 as the contact to be connected to positive control voltage leads (e.g., as opposed to a reference voltage lead), and/or may be used as contact points for multiple leads.

As examples, a positive control voltage may, for example, be a voltage between 31V and 32V, between 30V and 32V, between 31.3V and 31.5V, between 20V and 31.4V, less than 32V, less than 31.4V, greater than 1V, or any other suitable positive control voltage for operating actuator 400. In one embodiment, silver-paste-metalized contacts 404 of this type may be configured to receive a voltage of less than, for example, 32V and/or a current of less than, for example, 50 micro Amperes without causing damage to the contact and/or the actuator.

Silver paste 1200 may be formed on each contact 404 in a silver paste dot having a size characterized by a width W and a length L. Width W of each silver paste dot may, as examples, be greater than 180 microns, greater than 170 microns, greater than 150 microns, greater than 100 microns, between 180 microns and 280 microns, between 180 microns and 300 microns, between 180 microns and 380 microns, between 240 microns and 320 microns, between 275 microns and 285 microns, or less than 300 microns. Length L of each silver paste dot may, as examples, be greater than 120 microns, greater than 110 microns, greater than 100 microns, greater than 50 microns, between 120 microns and 250 microns, between 120 microns and 200 microns, between 130 microns and 170 microns, between 120 microns and 170 microns between 145 microns and 155 microns, or less than 200 microns.

Silver paste dots 1200 on electrical contacts 404 may be optimized for connection (e.g., to voltage supply leads) using conductive epoxy in accordance with an embodiment. In other embodiments, silver paste dots 1200 may be connected to, for example, voltage supply leads using other conductive coupling components or materials such as solder, anisotropic conductive film, or mechanical connector structures.

The silver paste dots of FIGS. 13 and 14 are formed on electrical contacts 404 of actuator 400. However, it should be appreciated that this is merely illustrative. In various embodiments, electrical contacts on any suitable MEMS device (e.g., a MEMS sensor, a MEMS actuator, or other types of MEMS device) may be metalized by sintering metal onto the MEMS devices (e.g., by sintering a silver paste on the MEMS device to form a silver-paste-metalized electrical contact).

Figure 15:
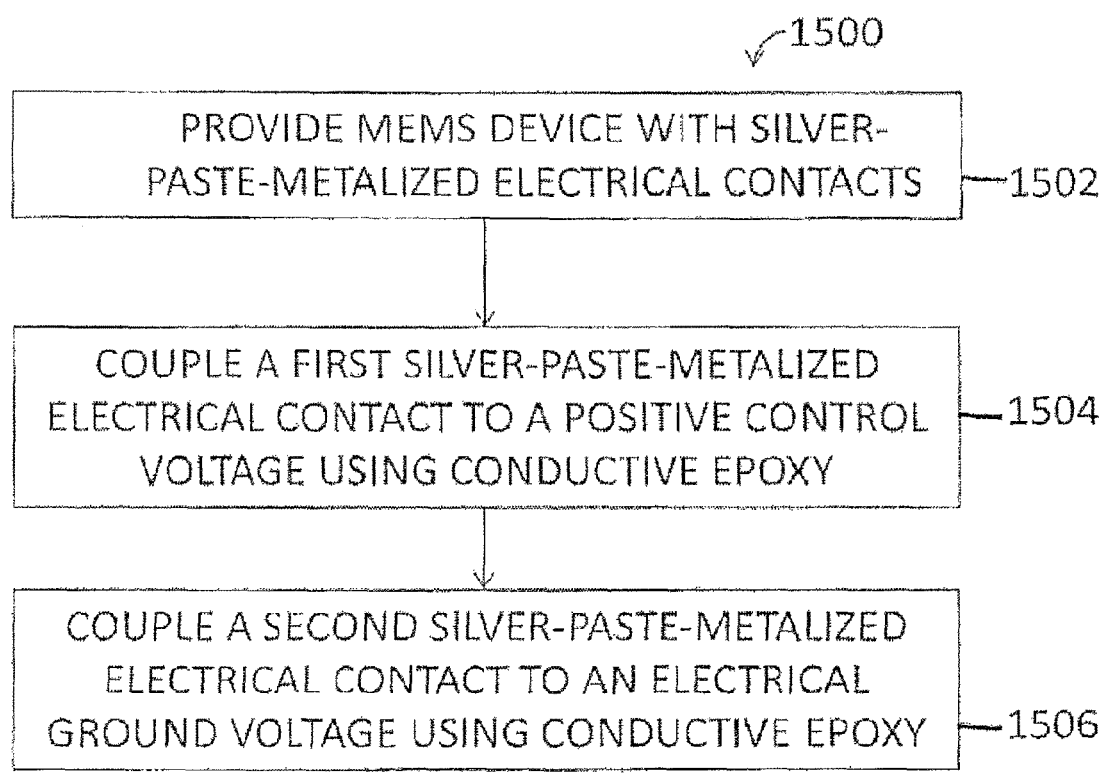
FIG. 15 is a flow chart showing an example of forming electrical connections to an actuator having silver-paste-metalized electrical contacts, in accordance with an embodiment.

FIG. 15 is a flow chart of an illustrative process 1500 of electrically connecting a MEMS device such as actuator 400 having at least first, second, and third silver-paste-metalized electrical contacts of the type disclosed herein. For example, the process 1500 may be used to electrically connect actuator 400 to a lens barrel 200.

At block 1502, a MEMS device such as a MEMS actuator having multiple degrees of freedom with motion control to limit undesirable movement may be provided that includes silver-paste-metalized electrical contacts. For example, in accordance with an embodiment, the provided MEMS device may include first, second, and third silver-paste-metalized electrical contacts. Each silver-paste-metalized electrical contact may include a silver paste dot such as silver paste dot 1200 of, for example, FIGS. 13 and 14.

At block 1504, a first silver-paste-metalized electrical contact may be coupled to a control voltage such as a positive control voltage, for example, using conductive epoxy. The conductive epoxy may be used to conductively secure the silver paste dot on the first silver-paste-metalized electrical contact to one or more lead lines such as compliant leads lines (e.g., from a lens barrel) that minimize strain on the electrical contact.

At block 1506, a second silver-paste-metalized electrical contact may be coupled to a second voltage such as a reference voltage (e.g., an electrical ground voltage) using conductive epoxy. The first and second silver-paste-metalized electrical contacts may be coupled to the respective voltages as described above in connection with blocks 1504 and 1506 while leaving the third silver-paste-metalized electrical contact (e.g., a silver-paste-metalized electrical contact having a chamfered edge) substantially free of conductive epoxy (for example). Leaving the third silver-paste-metalized electrical contact substantially free of conductive epoxy may include leaving the third silver-paste-metalized electrical contact substantially free of all electrical contacts. If desired, as described herein, the third silver-paste-metalized electrical contact may be replaced by an electrical contact that is not silver-paste-metalized.

A MEMS actuator may have multiple degrees of freedom. Once connected (e.g., using the process 1500), the MEMS actuator may receive control signals (e.g., voltages) that result in motion control to limit undesirable movement, to focus, to zoom, for optical image stabilization, and/or for alignment of optical elements for a miniature camera (as examples).

A MEMS actuator can embed or nest plural electrostatic drives, such as linear and rotational comb drives, to tend to minimize space, e.g., real estate, used therefore. Any desired number of electrostatic drives can be nested in any desired fashion.

Figure 16:
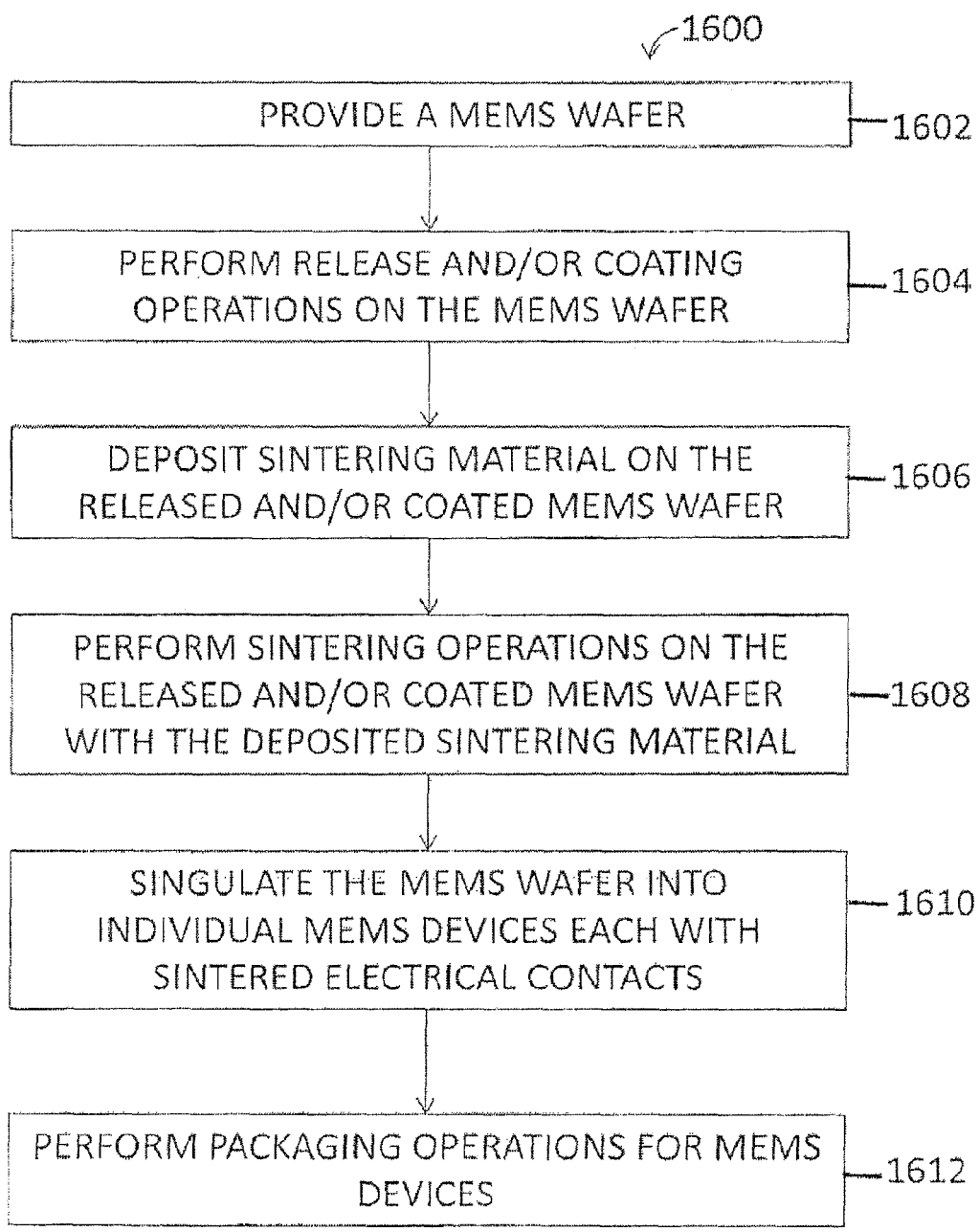
FIG. 16 is a flow chart showing an example of a process for forming electrical contacts for MEMS devices, in accordance with an embodiment

FIG. 16 is a flow chart of an illustrative process 1600 by which electrical contacts for MEMS devices may be formed. For example, the process 1600 may be used to form silver-paste-metalized electrical contacts on a MEMS device in accordance with an embodiment.

At block 1602, a MEMS wafer (e.g., a substrate having a plurality of unsingulated MEMS devices such as MEMS actuators and/or MEMS sensors) may be provided. The MEMS wafer may, for example, include a plurality of MEMS devices formed in a silicon substrate using various semiconductor processing techniques. One or more of the MEMS devices on the MEMS wafer may have one or more movable or actuatable portions that are secured by a material such as an oxide material on the substrate.

At block 1604, release operations and/or coating operations may be performed on the MEMS wafer. Performing release operations may include releasing the secured movable or actuatable portions of the MEMS devices (e.g., by etching away or otherwise removing the securing material). For example, an oxide material on the wafer that secures the movable or actuatable portions may be etched away in a hydrofluoric vapor etch process or other suitable etch process that releases that movable or actuatable portions of the MEMS devices on the MEMS wafer. In some embodiments, at block 1604, coating operations may be performed that form an additional layer such as an insulating layer on the MEMS wafer. For example, an additional layer such as a silicon nitride layer or an aluminum oxide layer may be deposited on the wafer or an additional layer such as an oxide layer may be grown on the wafer.

At block 1606, a material such as a sintering material (e.g., a metal powder, a metal preform, a metal ink, or a metal paste such as a silver paste) may be deposited on the released and/or coated MEMS wafer. The material may be deposited at locations on the wafer at which electrical contacts are to be formed. Depositing the material after the securing material has been removed (e.g., on a "released" MEMS wafer) may help prevent damage to electrical contacts on the MEMS devices caused by the etching process. In embodiments in which an additional insulating layer is formed at block 1604, the sintering material may, in some embodiments, be deposited onto the insulating layer.

At block 1608, sintering operations may be performed on the released and/or coated MEMS wafer that includes the deposited sintering material. Sintering operations may include baking the MEMS wafer to dry the deposited material and firing the MEMS wafer so that the deposited material diffuses into the wafer substrate, thereby forming Ohmic contacts with the MEMS devices. In configurations in which the sintering material is deposited on an insulating layer, sintering operations may include diffusing the sintering material through the insulating layer into the wafer substrate.

Baking the MEMS wafer may include heating the MEMS wafer at a baking temperature (e.g., a temperature between 100 C and 200 C, a temperature of between 140 C and 160 C, or a temperature of at least 100 C) for a baking time (e.g., less than 30 minutes, less than 60 minutes, less than 10 minutes, more than 5 minutes, or between 5 minutes and 15 minutes). Firing the MEMS wafer may include heating the MEMS wafer at a sintering temperature (e.g., a temperature greater than 700 C, greater than 800 C, greater than 850 C, greater than 900 C, between 700 C and 1000 C, between 800 C and 900 C, or less than 1000) for a sintering time (e.g., a time of less than 30 minutes, less than 60 minutes, less than 10 minutes, more than 5 minutes, or between 5 minutes and 15 minutes).

In one embodiment, firing the MEMS wafer may include heating the MEMS wafer from a temperature below 100 C to a temperature above 800 C in 5-15 minutes, holding the temperature of the MEMS wafer at greater than 800 C for 5-15 minutes, reducing the temperature of the MEMS wafer from greater than 800 C to less than 100 C in 5-15 minutes and cooling the MEMS wafer for 1-10 hours. In one embodiment, sintering operations may include firing the MEMS wafer at a temperature of at least 900 C so that an oxide layer grows on the wafer substrate during sintering operations.

At block 1610, the MEMS wafer may be singulated (diced) into individual MEMS devices each having one or more sintered electrical contacts such as silver-paste-metalized electrical contacts.

At block 1612, packaging operations may be performed for each MEMS device (e.g., a MEMS device such as a MEMS actuator having silver-paste-metalized contacts may be mounted in a lens barrel of a camera in a portable electronic device and coupled to control leads using conductive epoxy).

Figure 17:
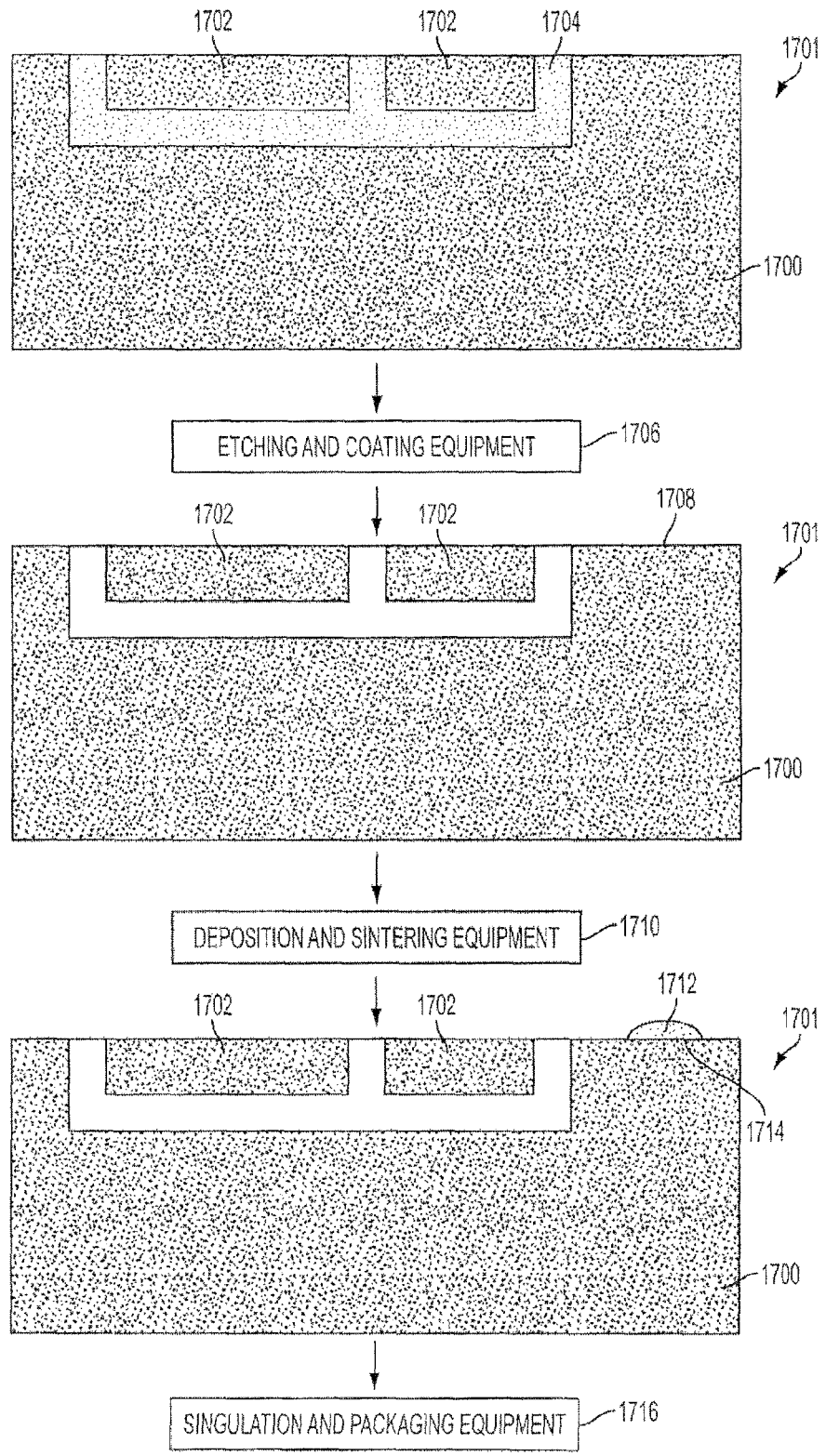
FIG. 17 is a diagram showing an illustrative portion of a MEMS wafer during various manufacturing stages during which sintered electrical contacts are formed on the MEMS wafer, in accordance with an embodiment.

FIG. 17 is a flow diagram showing a portion of a MEMS wafer during various manufacturing stages during which sintered electrical contacts are formed on the MEMS wafer according to an embodiment.

As shown in FIG. 17, a portion of a MEMS wafer 1701 may include a substrate such as substrate 1700 (e.g., a silicon substrate). A securing material such as material 1704 may secure moving portions 1702 of a MEMS device formed in substrate 1700. For example material 1704 may be an oxide material. MEMS wafer 1701 having securing material 1704 may be provided to processing equipment such as etching and coating equipment 1706. Etching and coating equipment 1706 may include etching equipment (e.g., equipment for performing etching processes such as hydrofluoric vapor etch processes) for removing material 1704 from MEMS wafer 1701 and/or coating equipment (e.g., equipment for coating MEMS wafer 1701 in additional layers such as insulating layer 1708).

Following removal of material 1704 (and optional addition of a coating 1708), MEMS wafer 1701 may be provided to additional processing equipment such as deposition and sintering equipment 1710. Deposition and sintering equipment 1710 may include equipment for depositing sintering materials such as metal powders, metal preforms, metal inks, or metal pastes such as silver paste onto a surface 1714 of MEMS wafer 1701. Deposition and sintering equipment 1710 may include heating equipment for performing sintering operations such as baking operations and firing operations that cause the deposited sintering material to dry and diffuse into substrate 1700, thereby forming sintered electrical contacts 1712 in Ohmic contact with substrate 1700. In configurations in which an insulating layer 1708 is deposited on wafer 1701, deposition and sintering equipment may cause the sintering material to diffuse through layer 1708 into substrate 1700, thereby forming a sintered electrical contact that forms an Ohmic contact with substrate 1700 through layer 1708.

Following formation of sintered electrical contacts such as contact 1712 on MEMS wafer 1701, MEMS wafer 1701 may be provided to further additional processing equipment such as singulation and packaging equipment 1716 that dices and/or packages individual MEMS devices such as MEMS actuators or MEMS sensors having sintered electrical contacts from MEMS wafer 1701.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed as new and desired to be protected is:

1. A device comprising:
   a microelectromechanical systems (MEMS) device formed from a wafer substrate, the MEMS device including
      a platform formed in the wafer substrate and defining an optical aperture having an optical axis, the optical aperture configured to transmit light therethrough, and
      a plurality of MEMS actuators formed in the wafer substrate and configured to move the platform with respect to the optical axis; and
   a sintered electrical contact formed directly on the wafer substrate of the MEMS device.

2. The device as recited in claim 1, wherein the sintered electrical contact comprises a sintered material selected from the group consisting of a sintered metal paste, a sintered metal powder, a sintered metal ink, and a sintered metal preform.

3. The device as recited in claim 1, wherein the sintered electrical contact comprises a silver-paste-metalized electrical contact.

4. The device as recited in claim 1, wherein the plurality of MEMS actuators includes:
   at least one out-of-plane MEMS actuator configured to move the platform along the optical axis; and
   at least one in-plane MEMS actuator configured to move the platform in a direction that is generally perpendicular to the optical axis.

5. The device as recited in claim 4, wherein the MEMS device comprises three in-plane MEMS actuators that are configured to cooperate to move the platform.

6. The device as recited in claim 5, wherein the out-of-plane MEMS actuator is nested at least partially within the three in-plane MEMS actuators.

7. The device as recited in claim 1, further comprising:
   a lens barrel with an electrical lead; and
   a conductive epoxy that connects the electrical lead to the sintered electrical contact.

8. The device as recited in claim 3, wherein the silver-paste-metalized electrical contact comprises a silver paste dot with a width that is between 180 microns and 300 microns and a length that is between 120 microns and 170 microns.

9. The device as recited in claim 1, wherein:
   the device comprises a camera having a lens;
   the MEMS device is configured to move the lens via the platform; and
   the sintered electrical contact is attached to an outer frame portion of the MEMS device by at least one kinematic mount flexure having a trench.

10. The device as recited in claim 1, wherein the device comprises a portable electronic device.

11. The device of claim 1, further comprising:
    an insulating layer deposited over the wafer substrate; and wherein
    the sintered electrical contact is diffused through the insulating layer and into the wafer substrate to be in Ohmic contact with the wafer substrate.

12. The device of claim 1, further comprising:
    a lens barrel having the MEMS device disposed therein; and
    a movable lens disposed within the lens barrel, the movable lens being coupled to move with the platform of the MEMS device and to direct light through the optical aperture.

13. The device of claim 12, wherein:
    the MEMS device further includes a flexure; and
    the sintered electrical contact is formed on the flexure.

14. A method, comprising:
    providing a microelectromechanical systems (MEMS) wafer having a plurality of MEMS devices, each of the plurality of MEMS devices including
       a platform formed in the MEMS wafer and defining an optical aperture having an optical axis, the optical aperture configured to transmit light therethrough, and
       a plurality of MEMS actuators formed in the MEMS wafer and configured to move the platform with respect to the optical axis;
    releasing at least one movable portion of each of the plurality of MEMS devices;
    depositing a material on the MEMS wafer; and
    forming a plurality of sintered electrical contacts directly on the MEMS wafer by sintering the material.

15. The method as recited in claim 14, wherein the depositing comprises depositing the material on the MEMS wafer after the releasing.

16. The method as recited in claim 15, wherein the forming comprises heating the MEMS wafer so that the material diffuses through an insulating layer into a substrate of the MEMS wafer.

17. The method as recited in claim 16, wherein the heating comprises heating the MEMS wafer to a temperature that is sufficient to allow oxide growth during the heating.

18. The method as recited in claim 14, wherein the depositing comprises depositing at least one of a metal paste, a metal preform, a metal ink, or a metal powder.

19. The method as recited in claim 14, wherein the depositing comprises depositing silver on the MEMS wafer.

20. A method, comprising:
    providing a microelectromechanical systems (MEMS) device having sintered first and second silver-paste-metalized electrical contacts formed directly on a wafer substrate portion of the MEMS device, the MEMS device further including
       a platform formed in the wafer substrate portion and defining an optical aperture having an optical axis, the optical aperture configured to transmit light therethrough, and
       a plurality of MEMS actuators formed in the wafer substrate portion and configured to move the platform with respect to the optical axis;
    coupling the first silver-paste-metalized electrical contact to a control lead; and
    coupling the second silver-paste-metalized electrical contact to a reference lead.

21. The method as recited in claim 20, further comprising:
   providing a control voltage to the first silver-paste-metalized electrical contact using the control lead; and
   providing a reference voltage to the second silver-paste-metalized electrical contact using the reference lead.

22. The method as recited in claim 20, wherein the MEMS device is coupled to a lens of a camera, the method further comprising:
   adjusting a position of the lens using the MEMS device by applying a voltage to the first silver-paste metalized electrical contact.

23. The method as recited in claim 20, wherein the MEMS device is disposed within a lens barrel of a camera in a portable electronic device, wherein the first and second silver-paste-metalized electrical contacts are each attached to an outer frame portion of an actuator of the MEMS device by at least one kinematic mount flexure having a trench, and wherein the lens barrel comprises the control lead, the method further comprising:
   focusing the camera by applying a control voltage to the first silver-paste-metalized electrical contact with the control lead.

\* \* \* \* \*